(12) United States Patent
Chong et al.

(10) Patent No.: US 8,575,954 B2
(45) Date of Patent: Nov. 5, 2013

(54) STRUCTURES AND PROCESSES FOR FABRICATION OF PROBE CARD ASSEMBLIES WITH MULTI-LAYER INTERCONNECT

(75) Inventors: Fu Chiung Chong, Saratoga, CA (US); William R. Bottoms, Palo Alto, CA (US); Erh-Kong Chieh, Cupertino, CA (US); Nim Cho Lam, Saratoga, CA (US)

(73) Assignee: Advantest (Singapore) Pte Ltd, Singapore (SG)

( * ) Notice: Subject to any disclaimer, the term of this patent is extended or adjusted under 35 U.S.C. 154(b) by 833 days.

(21) Appl. No.: 12/525,051

(22) PCT Filed: Jan. 31, 2008

(86) PCT No.: PCT/US2008/052644
§ 371 (c)(1),
(2), (4) Date: May 26, 2010

(87) PCT Pub. No.: WO2008/095091
PCT Pub. Date: Aug. 7, 2008

(65) Prior Publication Data
US 2010/0244867 A1 Sep. 30, 2010

Related U.S. Application Data

(63) Continuation of application No. 11/858,064, filed on Sep. 19, 2007, now Pat. No. 7,872,482, which is a continuation of application No. 11/133,021, filed on May 18, 2005, now Pat. No. 7,382,142, which is a continuation-in-part of application No. 10/870,095, filed on Jun. 16, 2004, now Pat. No. 7,349,223, which is a continuation-in-part of application No. 10/178,103, filed on Jun. 24, 2002, now Pat. No. 6,917,525.

(60) Provisional application No. 60/898,964, filed on Jan. 31, 2007, provisional application No. 60/891,192, filed on Feb. 22, 2007.

(51) Int. Cl.
*G01R 31/00* (2006.01)

(52) U.S. Cl.
USPC ............ 324/755.05; 324/762.05; 324/754.07; 438/117; 716/126

(58) Field of Classification Search
USPC .......................... 324/754.07, 754.1–754.14, 324/756.03–756.07, 762.01–762.05; 438/117; 257/E21.499; 716/126
See application file for complete search history.

(56) References Cited

U.S. PATENT DOCUMENTS 6,917,525 B2 * 7/2005 Mok et al. ...................... 361/767
7,750,651 B2 * 7/2010 Chao et al. ............... 324/756.03

(Continued)

*Primary Examiner* — Arleen M Vazquez
(74) *Attorney, Agent, or Firm* — Manuel de la Cerra

(57) ABSTRACT

Based upon a layout of a semiconductor wafer comprising a plurality of integrated circuits at pre-defined locations, each integrated circuit comprising a set of electrical connection pads, a probe chip contactor is established, having a unit standard cell on the probe side of the probe chip to correspond to each of the arranged integrated circuits. The unit standard cell is stepped and repeated for the probe side of the probe chip contactor, to establish a wafer scale standard cell layout. The opposite contact side of the probe chip contactor is connectable to a central structure, e.g. a Z-block or PC board, typically comprising a fixed array of vias with fixed X, Y, and Z locations. The routing of contact side of the probe chip contactor is preferably routed automatically, such as implemented on one or more computers, to provide electrical connections between the substrate through vias and the Z-block through vias.

44 Claims, 15 Drawing Sheets

(56) References Cited

U.S. PATENT DOCUMENTS

2007/0057684 A1* 3/2007 Chong et al. ................. 324/754
2007/0126443 A1* 6/2007 Grube et al. ................. 324/754
2008/0246500 A1* 10/2008 Chong et al. ................. 324/761

* cited by examiner

210z
Lower Right

STRUCTURES AND PROCESSES FOR FABRICATION OF PROBE CARD ASSEMBLIES WITH MULTI-LAYER INTERCONNECT

CROSS REFERENCE TO RELATED APPLICATIONS

This Application is a U.S. National Phase entry to PCT Serial No. PCT/US2008/052644 filed 31 Jan. 2008, which claims priority to U.S. Provisional to Application No. 60/898,964, filed 31 Jan. 2007, and to U.S. Provisional Application No. 60/891,192, filed 22 Feb. 2007.

Each of the aforementioned documents is incorporated herein in its entirety by this reference thereto.

FIELD OF THE INVENTION

The present invention relates generally to the field of miniaturized spring contacts and spring probes for high density electrical interconnection systems. More particularly, the present invention relates to microfabricated spring contact and probe card design and fabrication methods and apparatus and associated assembly structures and processes, and improvements thereto, for making electrical connections to semiconductor integrated circuits (ICs) having increasingly higher density and finer pitch input/output connections and the next level of interconnect in applications including but not limited to semiconductor device testing and packaging.

BACKGROUND OF THE INVENTION

Advances in semiconductor integrated circuit design, processing, and packaging technologies have resulted in increases in the number and density of input/output (I/O) connections on each die and as well as in an increase in the diameter of the silicon wafers used in device fabrication. With increasing numbers of I/O connections per die, the cost of testing each die becomes a greater and greater fraction of the total device cost. The test cost fraction can be reduced by either reducing the time required to test each die or by testing multiple die simultaneously.

Probe cards may be used to test single or multiple die simultaneously at the wafer level prior to singulation and packaging. In multiple die testing applications, the requirements for parallelism between the array of spring probe tips on the probe card and the semiconductor wafer become increasingly stringent since the entire array of spring probe tips are required to make simultaneous electrical contact over large areas of the wafer.

With each new generation of IC technology, the I/O pitch tends to decrease and the I/O density tends to increase. These trends place increasingly stringent requirements on the probe tips and associated probe card structures. Fine pitch probe tips are required to be smaller in width and length while continuing to generate the force required to achieve and maintain good electrical connections with the device under test. The force required to achieve a good electrical connection is a function of the processing history of the IC contact pad, such as but not limited to the manner of deposition, the temperature exposure profile, the metal composition, shape, surface topology, and the finish of the spring probe tip. The required force is also typically a function of the manner in which the probe tip "scrubs" the surface of the contact pad.

As the probe pitch decreases, the linear dimensions of the IC connection terminal contact areas also decreases, leaving less room available for the probe tips to scrub. Additionally, the probes must be constructed to avoid damaging the passivation layer that is sometimes added to protect the underlying IC devices (typically 5-10 microns in thickness). Additionally, as the spring probe density increases, the width and length of the probes tends to decrease and the stress within the probe tends to increase, to generate the force required to make good electrical contact to the IC connection terminal contact areas.

There is a need for probe cards for fine pitch probing comprised of an array of spring probe contacts capable of making simultaneous good electrical connections to multiple devices on a semiconductor wafer under test in commercially available wafer probers using specified overdrive conditions over large areas of a semiconductor wafer and or over an entire wafer. To accomplish this, the array of spring probe contacts on the probe card should be co-planar and parallel to the surface of the semiconductor wafer to within specified tolerances such that using specified overdrive conditions, the first and last probes to touch the wafer will all be in good electrical contact with the IC device yet not be subject to over stressed conditions which could lead to premature failure. Additionally, any changes in the Z position, e.g. due to set or plastic deformation, or condition of the probe tips, e.g. diameter, surface roughness, etc., over the spring probe cycle life should remain within specified acceptable limits when operated within specified conditions of use, such as but not limited to overdrive, temperature range, and/or cleaning procedures.

Micro-fabricated spring contacts are potentially capable of overcoming many of the limitations associated with conventionally fabricated spring contacts, e.g. tungsten needle probes, particularly in fine pitch probing applications over large substrate areas. Micro-fabricated spring contacts can be fabricated using a variety of photolithography based techniques known to those skilled in the art, e.g. Micro-Electro-Mechanical Systems (MEMS) fabrication processes and hybrid processes such as using wire bonds to create spring contact skeletons and MEMs or electroplating processes to form the complete spring contact structure. Arrays of spring contacts can be either be mounted on a contactor substrate by pre-fabricating and transferring them (either sequentially or in mass parallel) to the contactor substrate or by assembling each element of the spring contact array directly on the contactor substrate, such as by using a wire bonder along with subsequent batch mode processes.

Micro-fabricated spring contacts may be fabricated with variety of processes known to those skilled in the art. Exemplary monolithic micro-fabricated spring contacts may comprise stress metal springs having one or more layers of built-in or initial stress that are photolithographically patterned and fabricated on a substrate using batch mode semiconductor manufacturing processes. As a result, the spring contacts are fabricated en masse, and can be fabricated with spacings equal to or less than that of fine pitch semiconductor device electrical connection terminals or with spacings equal to or greater than those of printed circuit boards, i.e. functioning as an electrical signal space transformer.

In exemplary stress metal spring contacts, an internal stress gradient created within the spring contact causes a free portion of the spring contact to bend up and away from the substrate to a lift height that is determined by the magnitude of the stress gradient. An anchor portion remains fixed to the substrate and is electrically connected to a first contact pad on the substrate. The spring contact is made of an elastic material, which provides the free portion of the spring contact with flexibility and mechanical compliance. The force generated by stress metal spring contacts can be increased by the application of one or more plated metal layers comprising metals and metal alloys with appropriate Young's modulii, such as nickel or nickel cobalt, etc. Increasing the spring force helps to establish reliable electrical contacts and can also help to compensate for mechanical variations and induced by temperature changes and other environmental factors.

Photolithographically patterned spring structures are particularly useful in electrical contactor applications where it is desired to provide high density electrical contacts which may extend over relatively large contact areas and which also may exhibit relatively high mechanical compliance in the normal direction relative to the plane of the contact area. Such electrical contactors are useful for applications including integrated circuit device testing (both in wafer and packaged formats), integrated circuit packaging (including singulated device packages, wafer scale packaging, and multiple chip packages) and electrical connectors (including board level, module level, and device level, e.g. sockets. Photolithographically patterned spring structures are also well suited for the fabrication of electrical interposers capable of providing compliant electrical connections between arrays of electrical contacts.

As device pitch decreases and for other reasons mentioned above, it would be desirable for micro fabricated contactors and interposers to possess contact elements having increasing higher levels planarization and/or lift height uniformity.

It would be advantageous to provide a method and structure to fabricate improved microfabricated spring contacts either directly or indirectly across the surface of substrate areas, which can provide increased strength, longevity, and planarity, as well as superior electrical contact performance, over a wide variety of operating conditions e.g. temperature, cycle life, overdrive, pad metal, etc. Such a development would provide a significant technical advance.

Due to the inherent compatibility with the planar manufacturing processes used in printed circuit board and semiconductor fabrication, as well as the high level of inherent complexity, computer automated design or CAD tools are frequently utilized in the design and layout of contactors and probe cards comprising photolithographically patterned microfabricated spring contacts.

While it is sometimes desirable to employ commercially available CAD tools when their use is efficient and cost effective, it is sometimes desirable to develop or utilize customized design and layout tools in order to optimize and/or shorten the design cycle time or to provide functionality not present in commercially available CAD tools. Additionally, the specific design requirements of MEMs and/or photolithographic processes may best be addressed with customized CAD tools.

It would therefore be desirable to provide customized design tools that increase the level of automation and speed of CAD tools utilized in the design and layout of contactors and probe cards comprising photolithographically patterned microfabricated spring contacts. Such improvements would provide significant advances in the efficiency and cost effectiveness of contactor and probe card design.

The level of design complexity and hence the design cycle time is also a function of the physical architecture of the microfabricated device. It would therefore be desirable to reduce the design cycle time by optimizing the physical architecture of the microfabricated system by providing physical architectures that utilize a combination of standard components and customized CAD tools to provide reductions in the design and fabrication cycle time. Such improvements would also provide significant advances in the efficiency and cost effectiveness of contactor and probe card design.

SUMMARY OF THE INVENTION

Based upon a layout of a semiconductor wafer comprising a plurality of integrated circuits at pre-defined locations, each integrated circuit comprising a set of electrical connection pads, a probe chip contactor is established, having a unit standard cell on the probe side of the probe chip corresponding to each of the arranged integrated circuits. The unit standard cell is stepped and repeated across the probe side of the probe chip contactor, to establish a wafer scale standard cell layout. The opposite contact side of the probe chip contactor is connectable to a central structure, e.g. a Z-block, PC board or daughter card, typically comprising a fixed array of vias with fixed X, Y, and Z locations. The electrical connection traces on the contact side of the probe chip contactor are preferably routed automatically, such as implemented by auto-routing algorithms running on one or more computers, to provide electrical connections between the substrate through vias and the central structure through vias.

DETAILED DESCRIPTION OF PREFERRED EMBODIMENTS

Micro-fabricated spring contacts may be fabricated with a variety of processes known to those skilled in the art. Exemplary monolithic micro-fabricated spring contacts may comprise stress metal springs that are photolithographically patterned and fabricated on a substrate using batch mode semiconductor manufacturing processes. As a result, the spring contacts are fabricated en masse, and can be fabricated with spacings equal to or less than that of semiconductor bonding pads or with spacings equal to or greater than those of printed circuit boards, i.e. functioning as an electrical signal space transformer.

Fabrication of high density arrays of spring contacts are also possible using monolithic micro-fabrication processes wherein arrays of elastic, i.e. resilient, core members, i.e. spring contact skeleton structures, are fabricated directly on a contactor substrate utilizing thick or thin film photolithographic batch mode processing techniques such as those commonly used to fabricate semiconductor integrated circuits.

The spring constant of the spring is a function of the Young's modulus of the material used to fabricate the spring and the length, width, and thickness of the spring. The spring constant of the spring can be increased by enveloping the springs 40 with a coating of a metal including but not limited to electroplated, or sputtered, or CVD deposited nickel or a nickel alloy, gold, or a palladium alloy such as palladium cobalt (see FIG. 4).

The spring constant can be varied over many orders of magnitude by controlling the thickness of the deposited coating layer, the geometrical characteristics of the spring, and the choice of metal and the thickness and number of coatings. Making the springs thicker both increases the contact force and the robustness of the physical and electrical contact between the spring and its contact pad.

Figure 1:
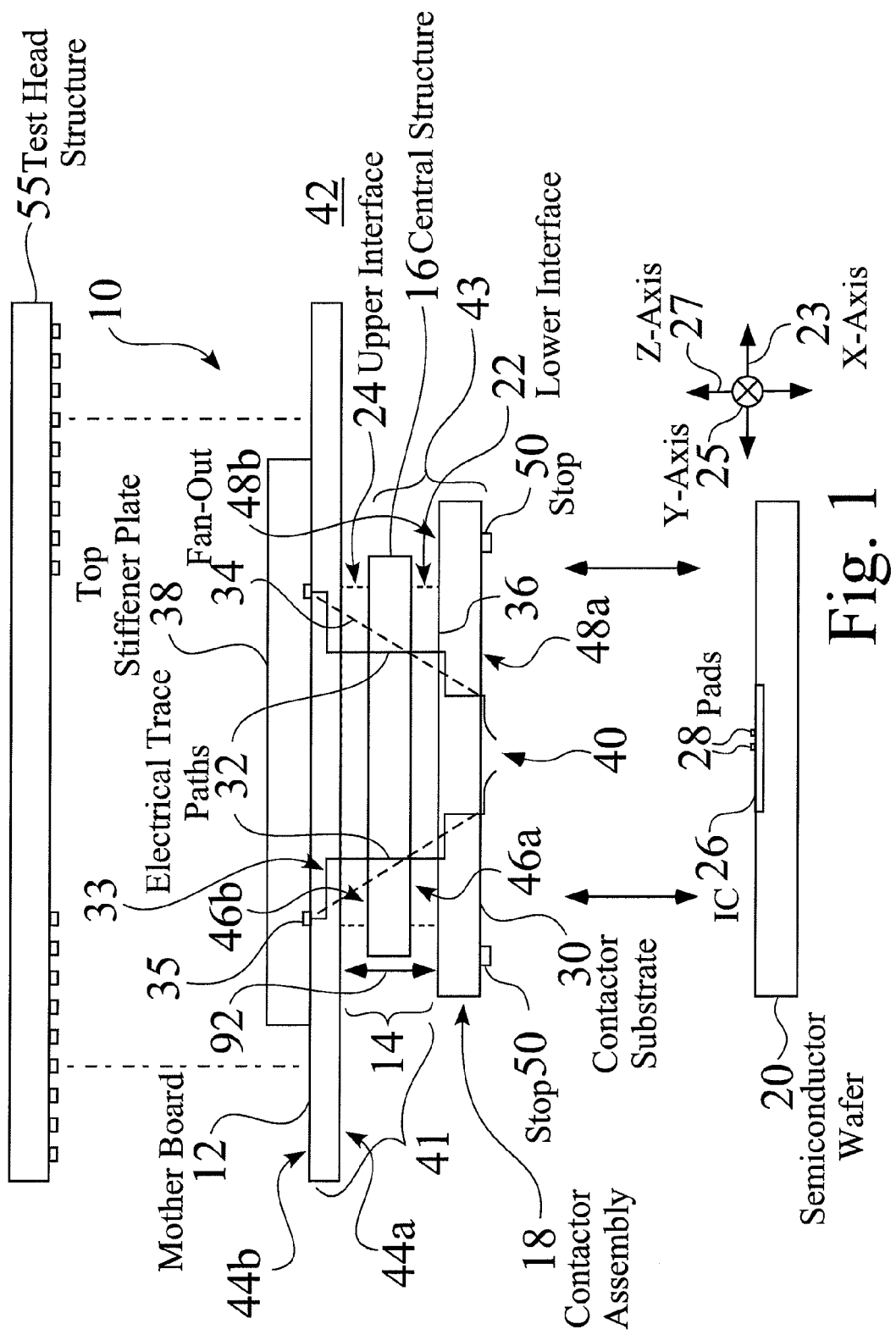
FIG. 1 is a schematic view of an exemplary probe card assembly for testing single die on a silicon wafer.

FIG. 1 is a detailed schematic diagram 10 of a probe card assembly 42 that is connectable to a test head structure 55. As seen in FIG. 1, the probe card assembly 42 may comprise an upper probe card interface assembly (PCIA) 41 and a contactor, i.e. probe chip contactor assembly 18, wherein the upper probe card interface assembly (PCIA) 41 comprises a motherboard 12 having electrical connections 33 extending therethrough, and an integrated contactor mounting system 14.

As seen in FIG. 1, the probe card assembly 42 may alternately comprise a lower probe card interface assembly (LPCIA) 43 connected to the mother board 12, wherein the lower probe card interface assembly (LPCIA) 43 comprises the probe chip contactor assembly 18 having electrical connections 66 (FIG. 2), e.g. probe chip is vias 66, extending therethrough, and a connected central structure 16, which is then connectable to the motherboard 12 through the upper interface 24.

As further seen in FIG. 1, electrical trace paths 32 extend through the motherboard 12, the contactor mounting system 14, and the contactor assembly 18, to spring contacts, i.e. spring probes 40, such as to establish contacts with pads 28 on one or more ICs 26 on a semiconductor wafer 20. Fan-out 34 may preferably be provided at any point for the electrical trace paths 32 in a probe card assembly 42 (or in other embodiments of the systems disclosed herein), such as to provide transitions between small pitch components or elements, e.g. contactor assemblies 18, and large pitch components or elements, e.g. tester contact pads 35 on the mother board 12. For example, fan-out may typically be provided by the mother board 12, by the contactor assembly 18, by a central structure 16, e.g. a Z-block 16, by an upper interface 24 comprising a motherboard Z-Block or one or more separable connectors 202 (FIGS. 11, 12, 14 and 17), or anywhere within the lower interface 22 and/or the upper interface 24.

Figure 3:
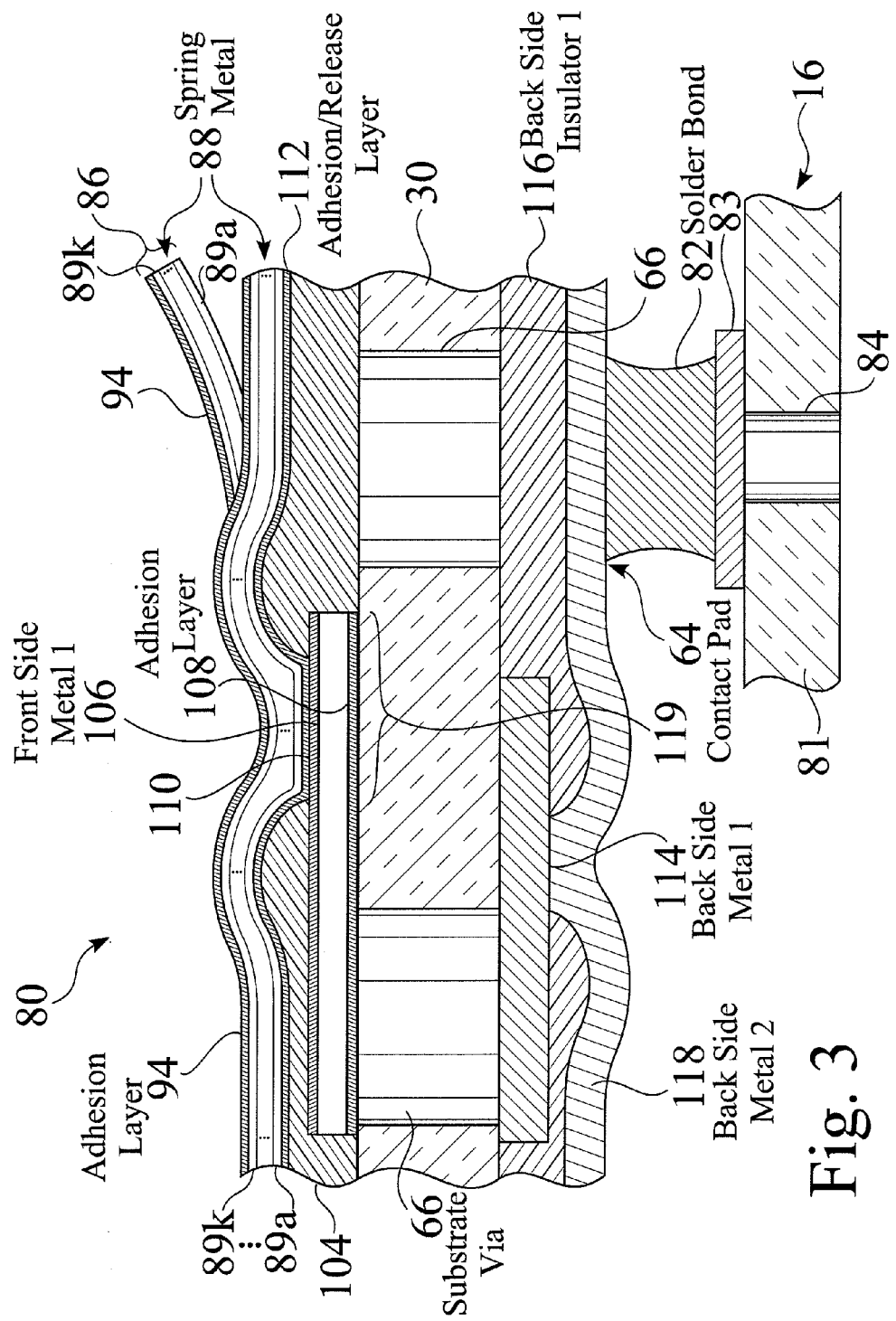
FIG. 3 is a partial cutaway view of an exemplary embodiment of multi-layer routing on the front and backside of a probe chip.

As also seen in FIG. 1, the contactor mounting system 14 typically comprises a central structure 16, e.g. such as but not limited to a Z-block, a PC board, or a daughter card. The mounting system also 14 typically comprises a lower interface 22 between the central structure 16 and the contactor substrate 30, and an upper interface 24 between the central structure 16 and the motherboard 12. In some probe card assemblies 42, the lower interface 22 comprises a plurality of solder bonds 82 (FIG. 3). As well, in some quick-change probe card assemblies 42, the upper interface 24 comprises a combination of componentry and connections, such as an interposer, separable connectors, solder bonds and/or a motherboard Z-block.

Additionally, optical signals can be transmitted through the contactor substrate 30, by fabricating openings of sufficient size through the substrate through which the optical signals can be transmitted. The holes may be unfilled or filled with optically conducting materials, including but not limited to polymers, glasses, air, vacuum, etc. Lenses, diffraction gratings and other optical elements can be integrated to improve the coupling efficiency or provide frequency discrimination when desired.

Figure 2:
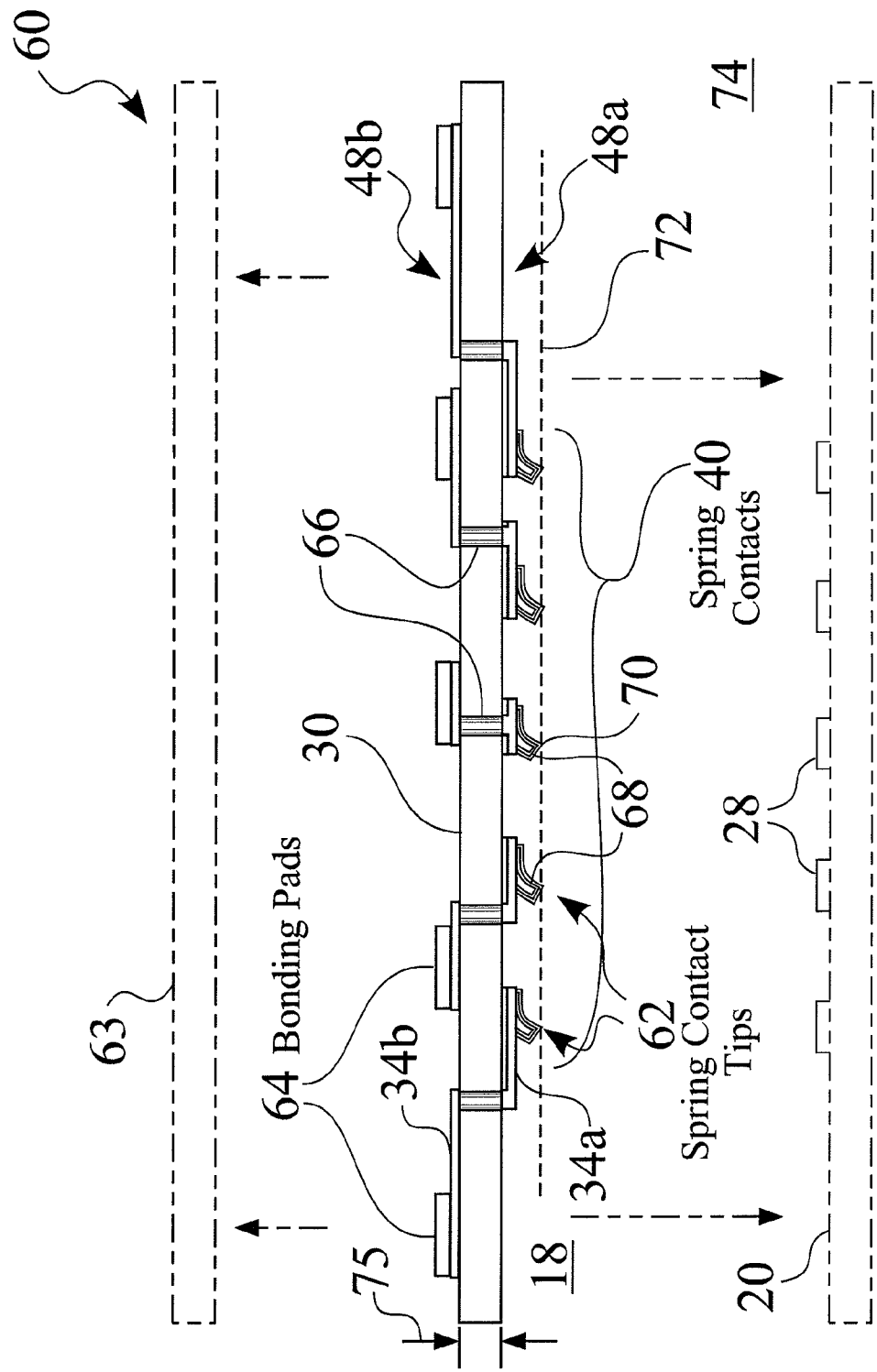
FIG. 2 is a schematic side view of an exemplary contactor assembly comprising an array of compliant micro-fabricated spring contacts.

FIG. 2 is a detailed schematic view 60 of a contactor, i.e. probe chip, assembly 18, in which the non-planar portions of compliant spring probes 40 are preferably planarized and/or plated. As seen in FIG. 2, a contactor assembly 18 comprises a contactor substrate 30 having a probing surface 48a and a contact surface 48b opposite the probing surface 48a, a plurality of spring probes 40 on the probing surface 48a, typically arranged to correspond to the bonding pads 28 (FIG. 1,2) of an integrated circuit 26 on a semiconductor wafer 20, and extending from the probing surface 48a to define a plurality of probe tips 62, a corresponding second plurality of bonding pads 64 located on the bonding surface 48b and typically arranged in a second standard configuration, and electrical connections 66, e.g. vias, extending through the probe chip contactor substrate 30 and one or more layers of electrical interconnections, i.e. routing layers, are provided for connecting each of the spring probes 40 to each of the corresponding second plurality of bonding pads 64.

While the contacts 40 are described herein as spring contacts 40, for purposes of clarity, the contacts 40 may alternately be described as contact springs, elastic core members, spring probes or probe springs.

Preferred embodiments of the spring contacts 40 may comprise either non-monolithic micro-fabricated spring contacts 40 or monolithic micro-fabricated spring contacts 40, depending on the application. Non-monolithic micro-fabricated spring contacts utilize one or more mechanical (or micro-mechanical) assembly operations, whereas monolithic micro-fabricated spring contacts utilize batch mode processing techniques including but not limited to photolithographic processes such as those commonly used to fabricate MEMs devices and semiconductor integrated circuits.

In some embodiments of the spring contacts 40, the electrically conductive monolithically formed contacts 40 are formed in place on the contactor substrate 30. In other embodiments of the spring contacts 40, the electrically conductive monolithically formed contacts 40 are formed on a sacrificial or temporary substrate 63, and thereafter are removed from the sacrificial or temporary substrate 63, e.g. such as by etchably removing the sacrificial substrate 63, or by detaching from a reusable or disposable temporary substrate 63, and thereafter affixing to the contactor substrate 30.

Both non-monolithic and monolithic micro-fabricated spring contacts can be utilized in a number of applications including but not limited to semiconductor wafer probe cards, electrical contactors and connectors, sockets, and IC device packages.

Sacrificial or temporary substrates 63 may be used for spring fabrication, using either monolithic or non-monolithic processing methods. Spring contacts 40 can be removed from the sacrificial or temporary substrate 63 after fabrication, and used in either free standing applications or in combination with other structures, e.g. contactor substrate 30.

In embodiments of contactor assemblies that are planarized, a plane 72 of optimum probe tip planarity is determined for a contactor assembly 18 as fabricated. Non-planar portions of spring contacts 40 located on the contactor substrate 30 are preferably plated 68, and are then planarized, such as by confining the probes 40 within a plane within a fixture, and heat treating the assembly. The non-planar portions of the spring probes 40 may also be plated after planarization, to form an outer plating layer 70.

The probe chip contactor assembly 18 shown in FIG. 2 further comprises fan-out 34, such as probe surface fan-out 34a on the probe surface 48a of the contactor substrate 30 and/or rear surface fan-out 34b on the bonding surface 48b of the contactor substrate 30. As seen in FIG. 3, a probe chip contactor may preferably comprise one or more additional layers on any of the front side 48a and the back side 48b, wherein multi-layer routing may preferably provide fan-out through a plurality of layers, to provide a plurality of controlled transitions between:

customer defined IC sites 26 (FIG. 1, FIG. 3), on the probe side 48a of the robe chip contactor 18; and standard arrays of pads 83 (FIG. 3) on a central structure 16 that are connectable to the contact side 48b of the probe chip contactor 18.

As described further below, the customer defined IC sites 26 are typically defined in a relatively small pitch "step and repeat" pattern across a wafer 20, while central structure pads 83 are typically defined in relatively larger pitch "grid" pattern across a central structure 16.

Monolithic micro-fabricated spring contacts 40, such as seen in FIG. 2, comprise a unitary, i.e. integral construction or initially fabricated using planar semiconductor processing methods, whereas non-monolithic spring contacts are typically assembled from separate pieces, elements, or components. Non-monolithic or monolithic micro-fabricated spring contacts can be fabricated on one or both sides of rigid or flexible contactor substrates having electrically conductive through-vias and multiple electrical signal routing layers on each side of the substrate to provide electrically conductive paths for electrical signals running from spring contacts on one side of the substrate to spring contacts or other forms of electrical connection points on the opposite side of the substrate through signal routing layers on each side of the substrate and one or more electrically conductive vias fabricated through the substrate.

An exemplary monolithic micro-fabricated spring contact comprising a stress metal spring i.e. an elastic core member, is fabricated by sputter depositing a titanium adhesion/release layer having a thickness of 1,000 to 5,000 angstrom on a ceramic or silicon substrate (approximately 10-40 mils thick) having 1-10 mil diameter electrically conductive vias prefabricated in the substrate. Electrically conductive traces fabricated with conventional photolithographic processes connect the spring contacts to the conductive vias and to the circuits to which they ultimately connect. A common material used to fabricate stress metal springs is MoCr, however other metals with similar characteristics, e.g. elements or alloys, may be used. An exemplary stress metal spring contact is formed by depositing a MoCr film in the range of 1-5 mm thick with a built-in internal stress gradient of about 1-5 GPa/mm. An exemplary MoCr film is fabricated by depositing 2-10 layers of MoCr, each layer about 0.2-1.0 mm thick. Each layer is deposited with varying levels of internal stress ranging from up to 1.5 GPa compressive to up to 2 GPa tensile.

Individual micro-fabricated stress metal spring contact "fingers" are photolithographically patterned and released from the substrate, using an etchant to dissolve the release layer. The sheet resistance of the finger and its associated trace can be reduced by electroplating with a conductive metal layer (such as copper, nickel, or gold). The force generated by the spring contact can be increased by electrodepositing a layer of a material, such as nickel, on the finger to increase the spring constant of the finger. In some applications, the quality of the electrical contact may optionally be improved by electrodepositing depositing a material, such as rhodium, onto the tip through a photomask, prior to releasing the finger from the substrate.

The lift height of the spring contacts is a function of the thickness and length of the spring and the magnitude of the stress gradient within the spring. The lift height is secondarily a function of the stress anisotropy and the width of the spring and the crystal structure and stress in the underlying stress metal film release layer. The spring constant of the spring is a function of the Young's modulus of the material used to fabricate the spring and the length, width, and thickness of the spring. The spring constant of the spring can be increased to the degree desired by enveloping the springs 40 with one or more electrodeposited, sputtered, or CVD metal coatings (see FIGS. 1,2). Coatings can be applied with thicknesses of between 1 micron and 100 microns using metals including nickel, gold, palladium, platinum, rhodium, tungsten, cobalt, iron, copper, and combinations thereof. The spring constant can be varied by controlling the thickness of the deposited coating layers, the geometrical characteristics of the spring, the choice of metal, and the number of coatings.

The microstructure and hence mechanical properties of the resulting spring contacts are a function of the metals deposited as well as the deposition and subsequent processing conditions. The process conditions for fabricating spring contacts according to the present invention comprise, electrodeposition current densities in the range of about 0.3 to about 30 Amperes/square decimeter (typically 3 Amperes per square decimeter) and saccharine added at a concentration of greater than about 1 gram/liter or preferably greater than 4.5 grams per liter. One or more heat treatment processes are preferably included, such as to provide any of probe tip planarization relative to the support substrate and/or annealment to provide increased resistance to set and cracking through repeated cycles of deflection over the life of the spring contact.

Grain sizes for spring coating or plating layers, e.g. 68,70 (FIG. 2), such as comprising nickel coatings 68,70 fabricated using the above conditions may typically range from about 200 nm to about 400 nm, e.g. as measured by SEM cross sections, but may range from as low as about 100 nm to about 500 nm before the anneal processing step. After the annealing processing step, the grain sizes typically grow to larger than about 400 nm, and may even exceed about 1000 nm.

It should be noted that methods for depositing coatings of both insulating and conductive materials are discussed in Yin et al., Scripta mater: 44 (2001) 569-574; Feenstra, et al, Materials Science and Engineering: A, Volume 237, Number 2, September 1997, pp. 150-158 (9); Kumar et al., Acta Materialia 51 (2003) 387-405), and patent publications, such as U.S. Pat. No. 6,150,186. Electrodeposited layers of metals such as nickel and nickel alloys such as Nickel Cobalt are characterized as having "nanocrystalline" microstructures when the grain sizes range from less than a few tens of nanometers to an extreme upper limit of 100 nm. From this description, the materials fabricated as described above would not be characterized as having nanocrystalline microstructures.

Setting, i.e. plastic deformation, of the probes during the useful life of the product can be minimized by carrying out an annealing process at an optimal time and temperature. For example, using a 250 C anneal temperature, it was observed that a minimum set occurred for a 3 hour anneal (5 microns) whereas for 1 hour and 12 hours annealing times, set was observed to be 28 microns and 12 microns respectively. Additionally, accelerated aging studies, i.e. repeated, cycling of the spring probes on a probe card using a wafer prober have shown that the spring contacts are resistant to cracking when fabricated with an anneal time selected to reduce set such as for the annealing process described above. However, it has also been observed that resistance to cracking decreases with anneal times in excess of that required to minimize set.

The above teachings describe the manufacture of an exemplary monolithic micro-fabricated stress metal spring, however, those skilled in the art will understand that spring contacts having the characteristics required to practice the present invention can provide many possible variations in design and/or fabrication processes. Such variations may include but would not be limited to, for example, choice of processes, process chemicals, process step sequence, base spring metal, release layer metal, coating metals, spring geometry, etc. The structures and processes disclosed herein may preferably be applied to a wide variety of non-monolithic spring contacts and monolithic micro-fabricated spring contacts, such as but not limited to spring structures disclosed in D. Smith and A. Alimonda, Photolithographically Patterned Spring Contact, U.S. Pat. No. 6,184,699; M. Little, J. Grinberg and H. Garvin, 3-D Integrated Circuit Assembly Employing Discrete Chips, U.S. Pat. No. 5,032,896; M. Little, Integrated Circuit Spring Contacts, U.S. Pat. No. 5,663,596; M. Little, Integrated Circuit Spring Contact Fabrication Methods, U.S. Pat. No. 5,665,648; and/or C. Tsou, S. L. Huang, H. C. Li and T. H. Lai, *Design and Fabrication of Electroplating Nickel Micromachined Probe with Out-of-Plane Deformation*, Journal of Physics: Conference Series 34 (2006) 95-100, International MEMS Conference 2006.

Contactor Assembly Structures Having Multiple Layer Interconnections.

FIG. 3 shows a cross sectional view of an exemplary probe chip contactor structure 80 having multiple layer interconnections, and connectable to a central structure 16, e.g. such as a Z-Block, a PC board or a daughter card. The exemplary structure 80 comprises an unplated lifted spring or probe finger 86, e.g. 40, and associated electrically conductive routing layer 88, a front side insulating layer 104, a first front side electrically conductive routing layer 106 having X and Y routing capability, a substrate 30 and an electrically conductive thru vias 66, a first back side electrically conducting routing layer 114, a back side insulating layer 116, and a second back side electrically conductive routing layer 118. In one embodiment, any of back side metal layers 114 and 118 comprise plated metal layers comprising any of copper, nickel, or gold. Both back side routing layers 114 and 118 have X and Y routing capabilities. In some embodiments of the multi-layer routing probe card structure 80, any of the front and back side insulating layers 104 and 116 comprise polyimide. In some of the embodiments of the probe chip contactor structure 80, at least one of the electrically conductive routing layers on any of the probe side 48*a* and the contact side 48*b*, e.g. such as but not limited to electrically conductive layers 106, 114, 118, 88, 89, 94, comprises any of copper, nickel, gold, MoCr, titanium, and chromium, TiNi, CrNi.

In the exemplary probe card structure 80 seen in FIG. 3, lateral stresses generated by heating, cooling and/or spring deflection are relieved by the front side insulating layer 104, which decouples stress between the spring layers, e.g. 86 and the substrate 30. In embodiments where the stress decoupling layer 104 is formed from a polymer, e.g. polyimide, the structure is capable of withstanding spring fabrication temperature cycles, as well as most extreme temperatures encountered in the use case, e.g. −100 C to +350 C.

Figure 10:
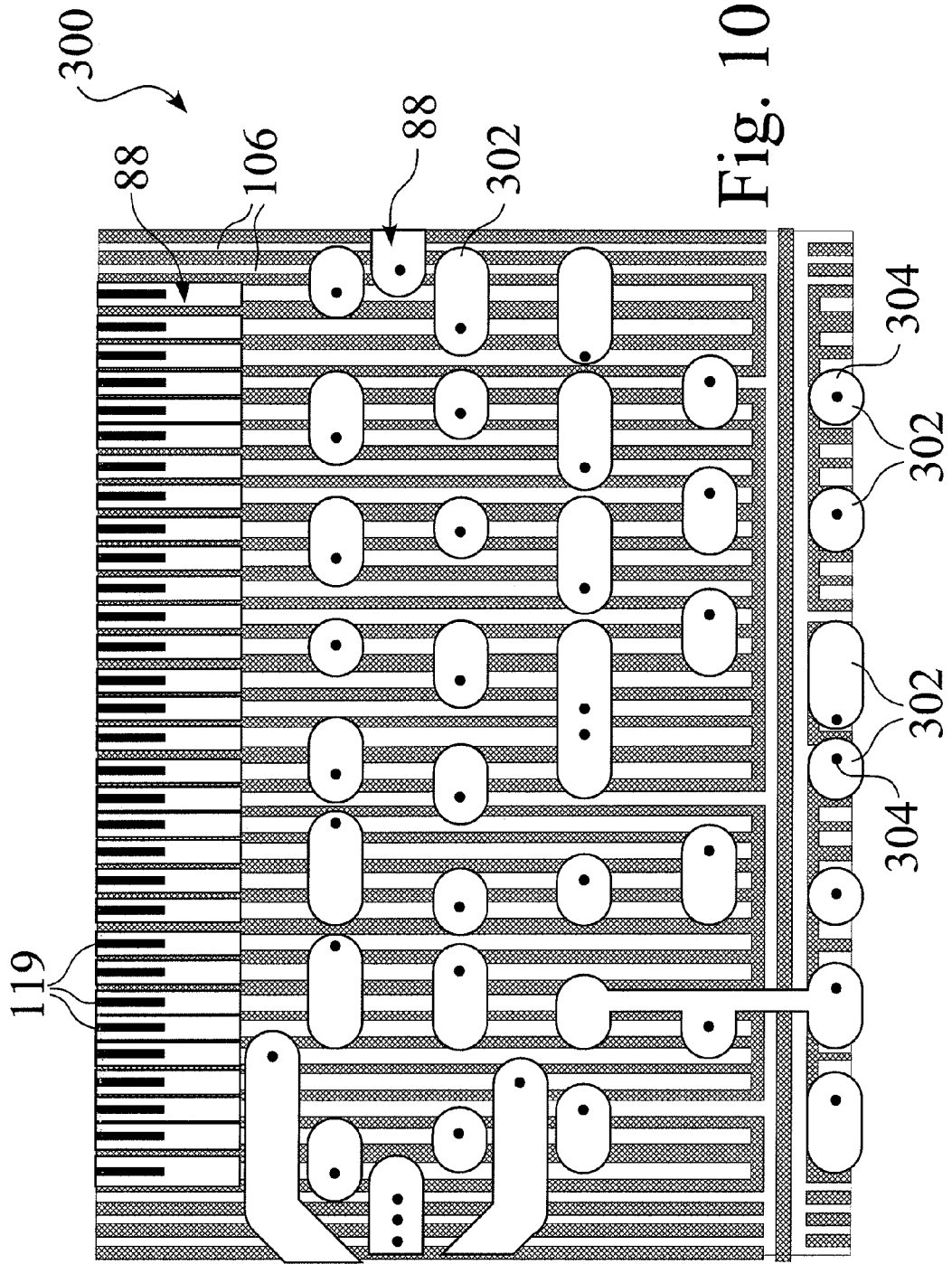
FIG. 10 is a first schematic plan view of a multi-layer routing structure using algorithm-based mask layer generation.
Figure 11:
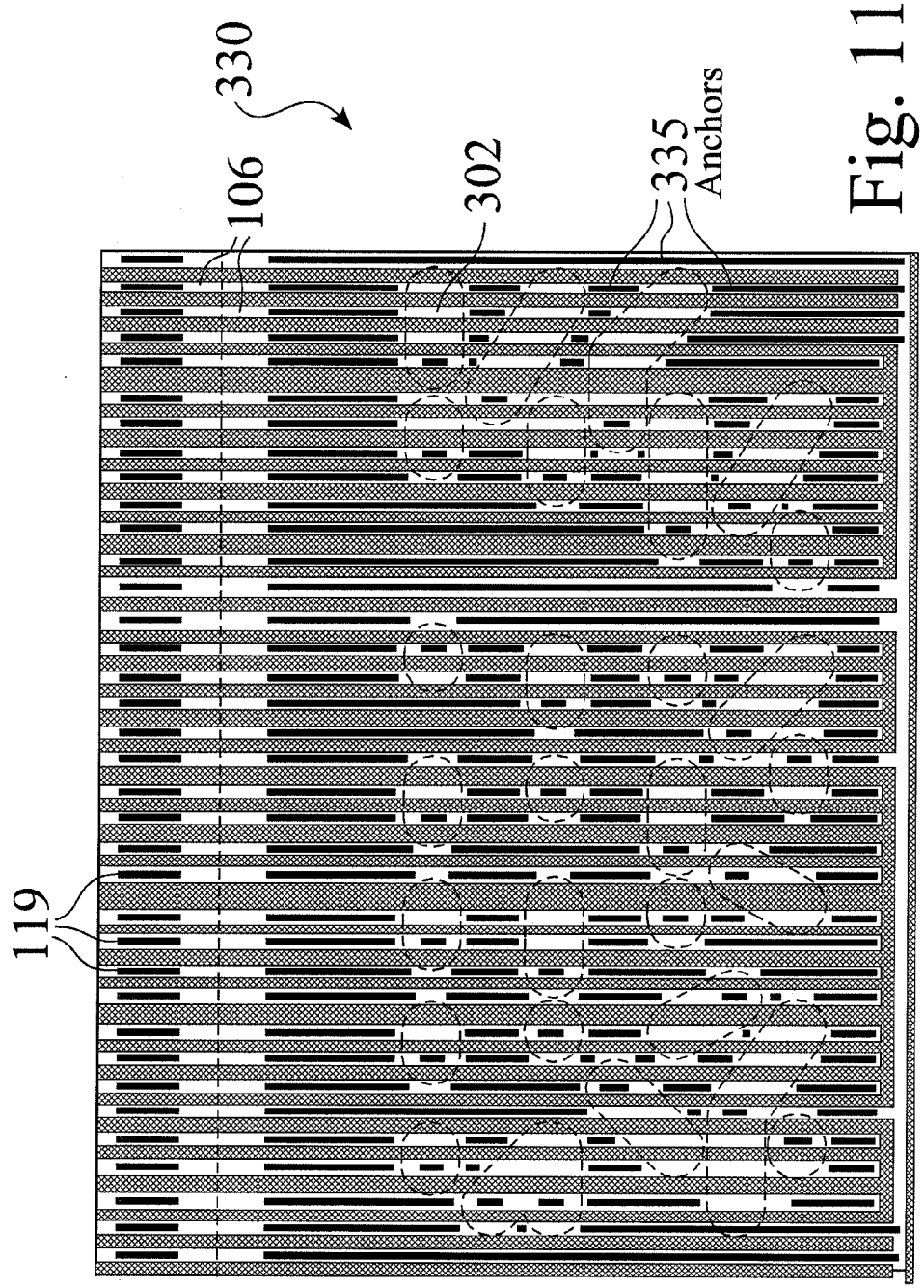
FIG. 11 is a second schematic plan view of a multi-layer routing structure using algorithm-based mask layer generation.

The disclosed decoupled spring and contactor structures provide numerous improvements, such as for providing improvement in any of fine pitch probing, cost reduction, increased reliability, and/or higher processing yields. For example, electrical contact between the spring probe structures, e.g. springs 40,86 and the substrate via structures, e.g. 66, is controllably defined with a formed fulcrum region 119 beneath the unlifted portion of the spring probe structure, e.g. such as seen in FIG. 10 or FIG. 11.

Decoupled spring and contactor structures may therefore provide improved process temperature performance and adhesion margin. As well, key parameters are decoupled in decoupled spring and contactor structures, whereby design parameters may be independently optimized. As well, Decoupled spring and contactor structures may readily be modeled and tested, provide advantages in scalability.

In some embodiments of the multi-layer routing probe card structure 80 and associated method 150, e.g. 150*a*,150*b*, measurement and/or compensation are provided for any of the lift height and the X-Y position of photolithographically is patterned spring contacts 40,86. For example, any of the spring length and angle may preferably be measured and/or adjusted on the photolithographic mask to compensate for any errors, e.g. dimensional or positional, measured in produced spring substrate assemblies.

The multi-layer routing probe card structure 80 and associated method 150, e.g. 150*a*,150*b*, can be applied to a wide variety of structures, such as described in any of U.S. Pat. No. 6,917,525; U.S. Pat. No. 6,799,976; U.S. Pat. No. 6,791,171; U.S. Pat. No. 7,126,220; U.S. patent application Ser. No. 11/133,021; U.S. Provisional Application No. 60/787,473; and U.S. Provisional Application No. 60/810,037, each of which are incorporated herein in their entirety by this reference thereto.

Figure 5:
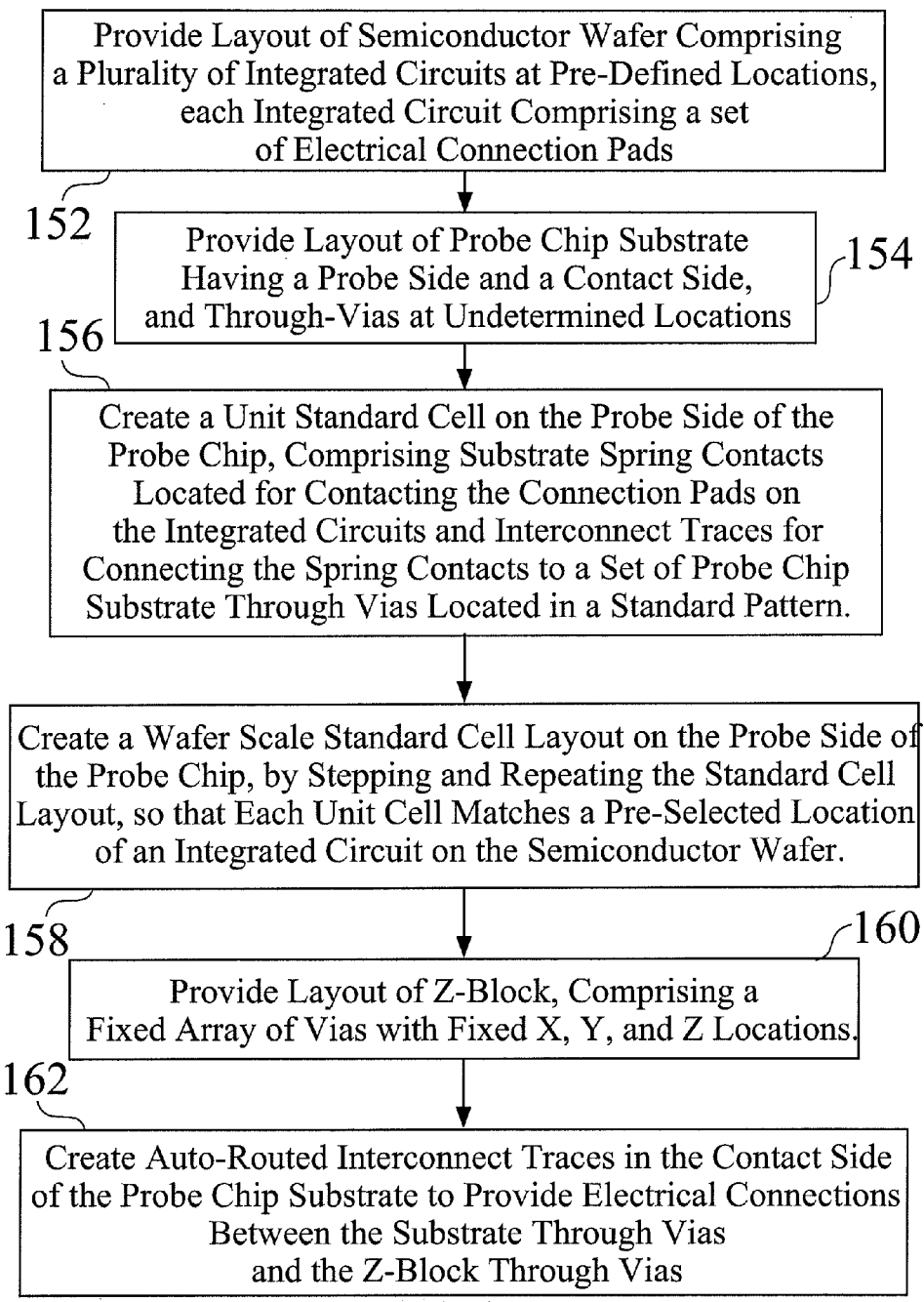
FIG. 5 is an exemplary process for standard cell architecture and automatically routed interconnections for a multi-layer routing structure.
Figure 14:
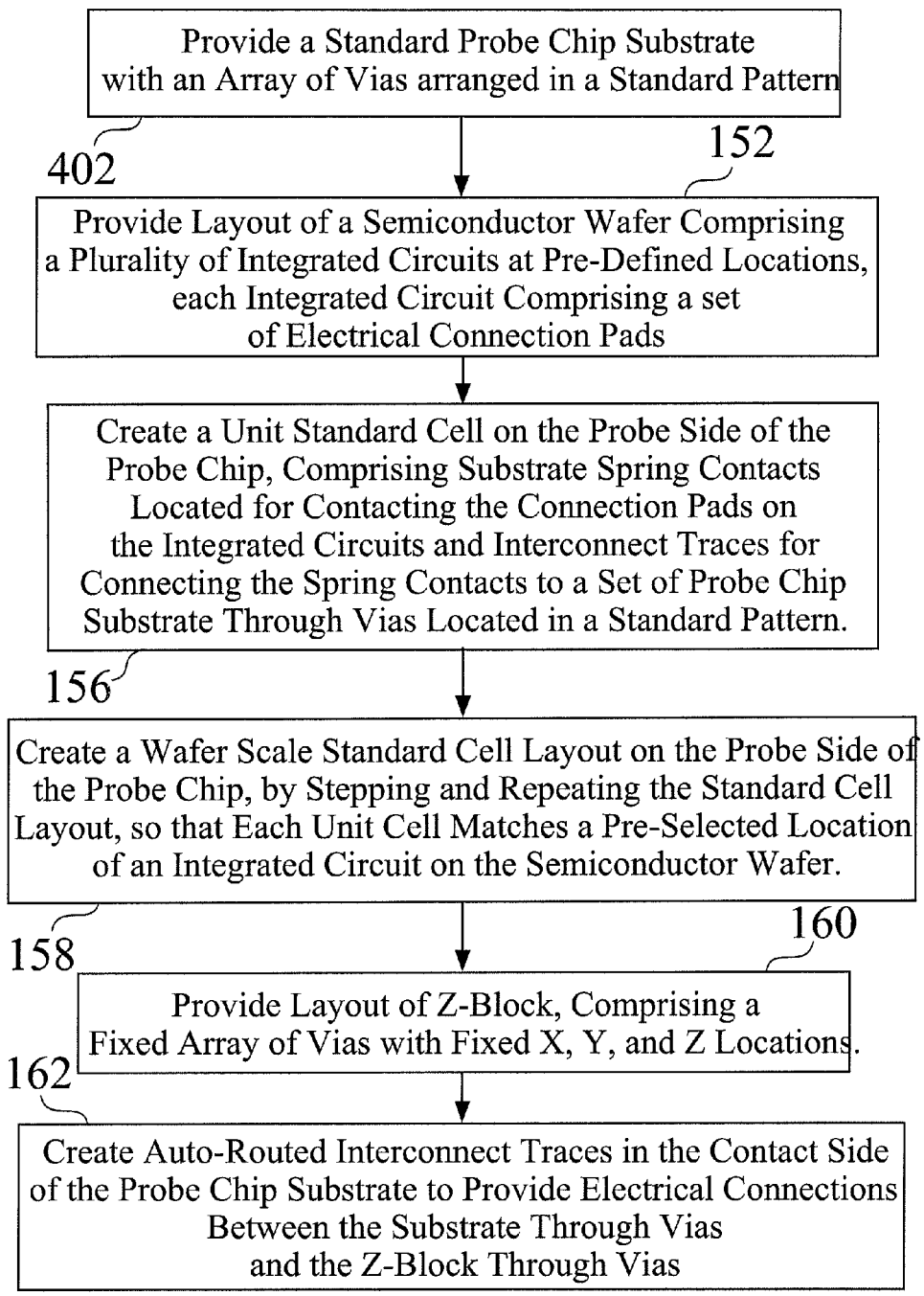
FIG. 14 an exemplary process for standard cell architecture and automatically routed interconnections for a multi-layer routing structure, using a probe chip having predetermined array of vias.

Multi-layer probe card structures 80, and related processes 150, e.g. 150*a*,150*b*, provide a cost effective and efficient means for parallel testing of multiple IC die 26 on a semiconductor wafer 20. In one embodiment, multiple IC dice 26 are interconnected to an IC tester 55 (FIG. 1) with parallel testing capabilities, by way of a multi-layer probe card structure 80 fabricated according to the associated process 150, e.g. 150*a*, 150*b* (FIG. 5, FIG. 14).

The present teachings include structures and processes for fabrication of probe card assemblies comprising probe chips having multi-layer interconnect and methods for design of probe card assemblies including the layout of the electrical routing connections between the IC dice 26 and the IC tester.

In one embodiment, the connection pads 28 of the IC dice 26, spaced at a first tight pitch, are interconnected through a probe chip 18 having multi-layer interconnections, to an array of relatively larger electrically conductive pads 64 spaced at a relatively larger (coarse) pitch to provide solderable electrical and mechanical connections to an array of electrical connection terminals 83 on the surface of a central structure 16, e.g. a Z-block structure 16. Each member 83 of the array of Z-block connection terminals 83 is connected to a corresponding member of an array of fabricated through central structure vias 84.

In an alternative embodiment, the probe chip 18 is soldered to a central structure 16, such as comprising any of a PC board, i.e. a printed circuit wiring board, a burn-in board, a tiled array, one or more separable connector, or a daughter card. In some exemplary embodiments, the central structure substrate 81 (FIG. 3) comprises any of ceramic, glass, and FR-4.

The probe chip substrate 30 comprises electrically conductive vias 66 spaced at an intermediate pitch relative to the IC dice construction pads 26. In the exemplary multi-layer probe chip embodiment is shown in FIG. 3, the probe chip substrate 30 may comprise any of ceramic, glass, glass ceramic, quartz, and silicon. Electrically conductive vias 66 extend from the probe surface 48$a$ to the opposite contact surface 48$b$.

In some embodiments, the substrate vias 66 are chosen to comprise any suitable material with characteristics comprising any of electrical conductivity and retention in the substrate throughout the fabrication process, such as for thermal stress performance and/or mechanical stress performance. For example, in some embodiments of the probe chip contactors 18, the electrically conductive substrate through vias 66 comprise any of copper, tungsten silver, platinum and their alloys and combinations thereof.

In some embodiments, the spring metal 88 comprises one or more layers 89$a$-89$k$, of metal, e.g. such as but not limited to MoCr. As well, one or more layers may be provided any of below and above the primary spring layers 89. For example, an exemplary spring 86 may comprise one or more adhesion or release layers 112, e.g. deposited Ti, followed by one or more spring layers 89, e.g. 89$a$-89$k$, such as but not limited to MoCr, and then followed by an external layer 94, e.g. Au, wherein the composite structure 86 has a combined thickness of about 1 to 10 microns.

In some embodiments of the multi-layer probe chip structure 80, the front or back side insulative layers 104,116 may comprise an electrically insulative material, e.g. such as but not limited to polyimide, which may typically be deposited to a thickness of about 1 to about 20 microns. The front side insulative layer 104 and/or the back side insulative layer 116 may comprise materials other than polyimide, such as but not limited to benzocyclobutene (BCB). As well, other deposition thickness ranges may be appropriate, depending on desired properties, such as the dielectric constant of the insulator. For example, material having a relatively low dielectric constant may be chosen to provide improved high frequency performance.

In some embodiments of the multi-layer probe chip structure 80, the primary front side metal 106 may comprise one or more deposited layers, e.g. Ni or Cu, such as formed by sputtering or plating. An adhesion layer 108, e.g. such as comprising titanium, may be applied before forming the primary front side metal 106. In some embodiments of the multi-layer probe chip structure 80, the primary front side metal 106 may comprise a thickness of about 0.1 to about 5 microns or equivalent, to lower electrical trace resistance, optionally followed by an outer deposited layer 110, wherein the outer layer is typically deposited by any of sputtering, plating, and electroless deposition. While some embodiments of the outer deposited layer 110 comprise any of Ti and Au, other metals and combinations of metals may be chosen to provide any of electrical, mechanical, and metallurgical interfacial characteristics.

The first back side metal layer 114 may comprise a sputtered metal seed layer e.g. such as but not limited to any of Cr, Cu and Ti, typically up to about 1 micron thick, with an over layer, such as comprising electroplated copper, having a thickness of about 1 micron to about 25 microns, to provide lower trace resistance, however, other metals with other thicknesses and combinations thereof may be substituted as desired.

The second side metal layer 118 may typically comprise a deposited metal seed layer 188, such as deposited by any of sputtered or electroless deposition. In some embodiments, the second side metal layer 118 comprises any of Cr, Cu, and Ti, such as having a thickness up to about 1 um, and may additionally be over coated with an electroplated conductive metal layer, such as but not limited to copper (Cu), to provide lower trace resistance, and may additionally followed with subsequent metal layers, e.g. any of Ni and Au, such as to provide a solderable interface layer, such as having a combined thickness of about 1 to about 25 microns.

As seen in FIG. 1, the multi-layer interconnect structures 80 may be used for tester interfaces. In alternative embodiments, multi-layer interconnect structures 80 are used for device packaging, wherein the front side multi-layer structures are fabricated on or otherwise directly attached to IC devices 26.

Additional layers of insulators and metals can be added to either or both the front side 48$a$ and the backside 48$b$ of the substrate 30, or to the IC device substrate 20. Adding metal layers provides increased numbers of routing channels, and allows for the implementation of stripling style controlled impedance structures, i.e. signal traces running between two ground planes. Thus, the benefits of multi-layer interconnect structures 80 include but are not limited to any of:

improved high frequency performance;

lower emitted radiation;

lower cross talk;

higher connection densities;

simplified design and layout requirements and procedures; and compatibility with automated design and layout tools and strategies.

The probe chip cross section seen in FIG. 3 shows an exemplary embodiment of multi-layer routing on the front side 48$a$ and back side 48$b$ of the probe chip contactor 18. In this example, two layers are shown on the front and back sides 48$a$,48$b$ of the substrate 30. In other embodiments, more or less layers of routing can be provided on either the front or back sides of the probe chip substrate 30.

In addition, embedded components, including active components (such as diodes, transistors, integrated circuits, etc.) and passive components (such as resistors, capacitors, and inductors) can be either fabricated as integral components of either the substrate 30 or the front or back side metal and insulating layers, or can be assembled to suitable bonding areas with appropriate electrical and mechanical connections provided.

Figure 4:
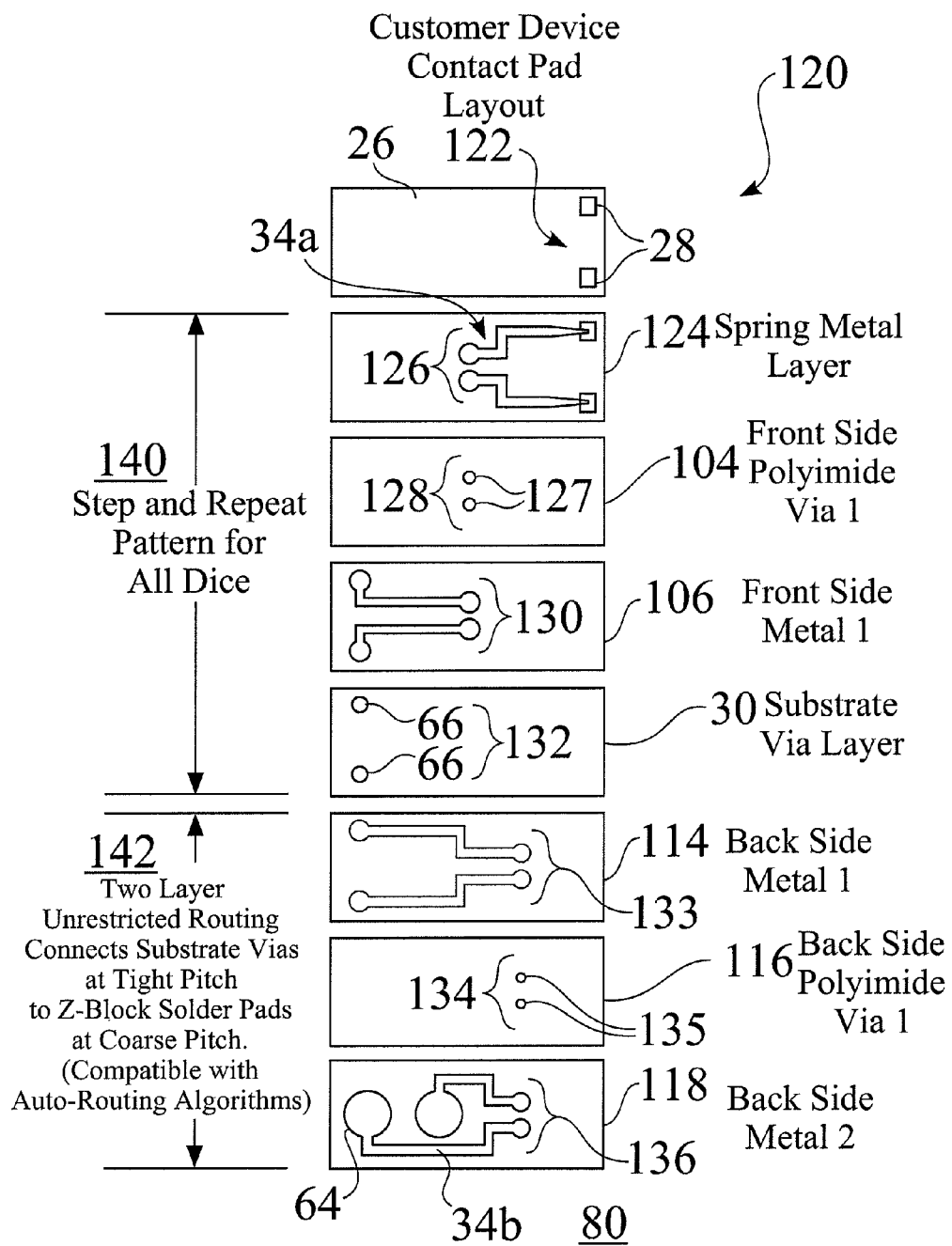
FIG. 4 is an expanded assembly view of a dual sided multi-layer routing structure.

FIG. 4 is an expanded assembly view 120 of an exemplary dual sided multi-layer routing structure 80 for interconnecting and routing IC dice connection pads, at a relatively fine pitch, to Z-block solder pads 83, at a relatively coarse pitch, by way of substrate vias 66. The lifted probe fingers 40,86 on the spring metal layer, i.e. spring contact elastic members, are positioned, such as determined by a customer device contact pad layout 122, such that the tips 62 of the elastic members 86 make compliant electrical contacts when compressed and engaged with the IC device contact pads 28.

In other embodiments, the elastic members are coated with one or more electro-plated layers which increase the spring to optimize probing conditions, e.g. such as to lower resistance, minimize damage, minimize wear to the probe and the device, and/or minimize debris pick-up, etc., thus optimizing the interface with the IC device pad.

As seen in FIG. 4, the springs 40,86 are defined by a pattern 126 on the spring metal layer 124, and may include a first probe side fan-out 34a. For example, as seen in FIG. 4, the spring pattern 126 extends from the spring probes 40 toward contact regions 127 that extend through the front side insulative layer 104, that are defined by front side contact pattern 128. Within the front side metal 1 layer 106, electrically conductive traces typically extend, as defined by a trace pattern 130, from the contact regions 127 toward the probe chip vias 66, that are defined by a via pattern 132. On the opposite, i.e. contactor side 48b of the probe chip substrate 30, within the back side metal 1 layer 114, electrically conductive traces typically extend, as defined by a backside trace pattern 133, from the probe chip vias 66, to the back side contact regions 135, that are defined by a contact pattern 134. On the back side metal 2 layer 118, electrically conductive traces extend from the back side contact regions 135 to the back side contact pads 64 (FIG. 2), and may include a back side fan-out 34b. The back side contact pads 64 typically correspond with contact pads 83 on the central structure 16, e.g. a Z-block, PC board or daughter card.

As also seen in FIG. 4, the multiple routing patterns for the different layers on the front side 48a of the probe chip contactor 18 are preferably stepped and repeated 140 for connection to all dice 26. As also seen in FIG. 4, on the back side 48 of the probe chip contactor 18, a plurality of layers provide unrestricted routing connections, such as between substrate vias 66 at a relatively tight pitch, to Z-block solder pads 83 at a coarser pitch, which is compatible with auto-routing programs.

FIG. 5 is an exemplary process 150a for standard cell architecture and automatically routed interconnections for a multi-layer routing structure 80. For example, the process 150 typically starts by providing 152 a layout of a semiconductor wafer 20, comprising a plurality of integrated circuits 20 at pre-defined locations, wherein each integrated circuit comprises a set of electrical connection pads 28 having a defined pattern 122 (FIG. 4). This stepped and repeated pattern 122 across a semiconductor wafer 20 provides a first, i.e. customer, end of the input for the auto-routing process.

An initial layout of the probe chip contactor substrate 39 is provided 154, wherein the substrate 30 has a probe side 48a and a contact side 48b opposite the probe side 48a, and through-vias 66 at undetermined locations.

A unit standard cell 140 is then created for the probe side 48a of the probe chip 18, comprising substrate spring contacts 40,86 located for contacting the connection pads 28 for one of the integrated circuits 26, and interconnect traces 126, 127, 130 for connecting the spring contacts 40,86 to a set of probe chip substrate through vias 66, which are typically located in a standard pattern 132.

A wafer scale standard cell layout is then created 158 for the probe side 48a of the probe chip 16, by stepping and repeating the standard cell layout 140, so that each unit cell matches a pre-selected location of an integrated circuit 26 on the semiconductor wafer 20.

A layout of a central structure 16, e.g. Z-block 16, is also typically provided 160 as an input to the process 150, wherein the Z-block 16 comprises a fixed array of vias 84 with fixed X, Y, and Z locations, and resultant solder pads 83.

An automatic routing of interconnect traces 133, 134, 136 is then created 162 for the contact side 48b of the probe chip substrate 30, to provide electrical connections between the substrate through vias 66 and the Z-block through vias 84.

In some embodiments of the auto-routed structure 80, one of the two metal layers on either side of the substrate 30 can serve as a ground plane and the other can serve as the signal layer. Controlled impedance transmissions, such as microstrip transmission lines or low voltage differential signal (LVDS) transmission lines, whose design parameters are well known to those skilled in the art, can be implemented using photolithographically defined metal patterns in the two metal layers, e.g. the first front side metal 106 and spring metal 88, separated by an insulating layer, e.g. front side insulator 104.

In another embodiment, three metal layers (along with adjacent insulating layers) can be provided on either or both of the front side 48a or the back side 48b of the substrate 30, to support the fabrication of strip line controlled impedance structures, e.g. signal traces sandwiched between a top metal layer e.g. 88, and upper insulating layer and a bottom metal layer, e.g. 106, and lower insulating layer.

In probe card assemblies 42 where many identical IC die 26 are to be tested in parallel, the design and layout process can be simplified if the layout 126 of the spring contact probes 40,86 (which are co-located with the IC electrical connection pads 28 and associated interconnects 127, 128, 130 through the front side spring metal 88 to the substrate 30 through vias 66) is done only once, and therefore optimized for a single IC die 26. The connection pattern can then be stepped and repeated 140 to form a full array of die 26 to be tested. Improved plating uniformity within a die site leads to uniform spring force at a given overdrive. Uniformity of the spring metal layer may preferably be optimized, for example, by adjusting probe finger length and width as well as by the addition of thieving lines, i.e. grounded conductive areas uniformly distributed in relation to other functional routing, that do not provide routing, but help maintain uniform plating bath concentrations, thus providing improved plating uniformity over the entire probe chip substrate 30.

In some embodiments of the auto-routed structure 80 and process 150, the array formed by repeated substrate through via patterns can not be aligned with the array of Z-block solder pads 83, which are typically located on a regular array with a fixed spacing between centers. The substrate through via array 66 may not align with the Z-block array 84, due to differences in pitch from die to die. The physical consequence of these pitch and spacing differences is that the interconnection layout between the through vias on the back side of the substrate and the central structure solder pads 83, i.e. the back side signal routing, may have die location to die location variations. While it is possible to manually layout the back side routing, it is advantageous to use automated routing tools to do the back layout automatically quickly and without errors. The presence of two or more back side routing layers, as seen in FIG. 3 and FIG. 4, insures that virtually all possible layouts can be done via computational algorithms, i.e. auto routing by computer. In addition, the presence of two or more back side routing layers insures that the back side pads can be utilized with optimal efficiency.

Figure 6:
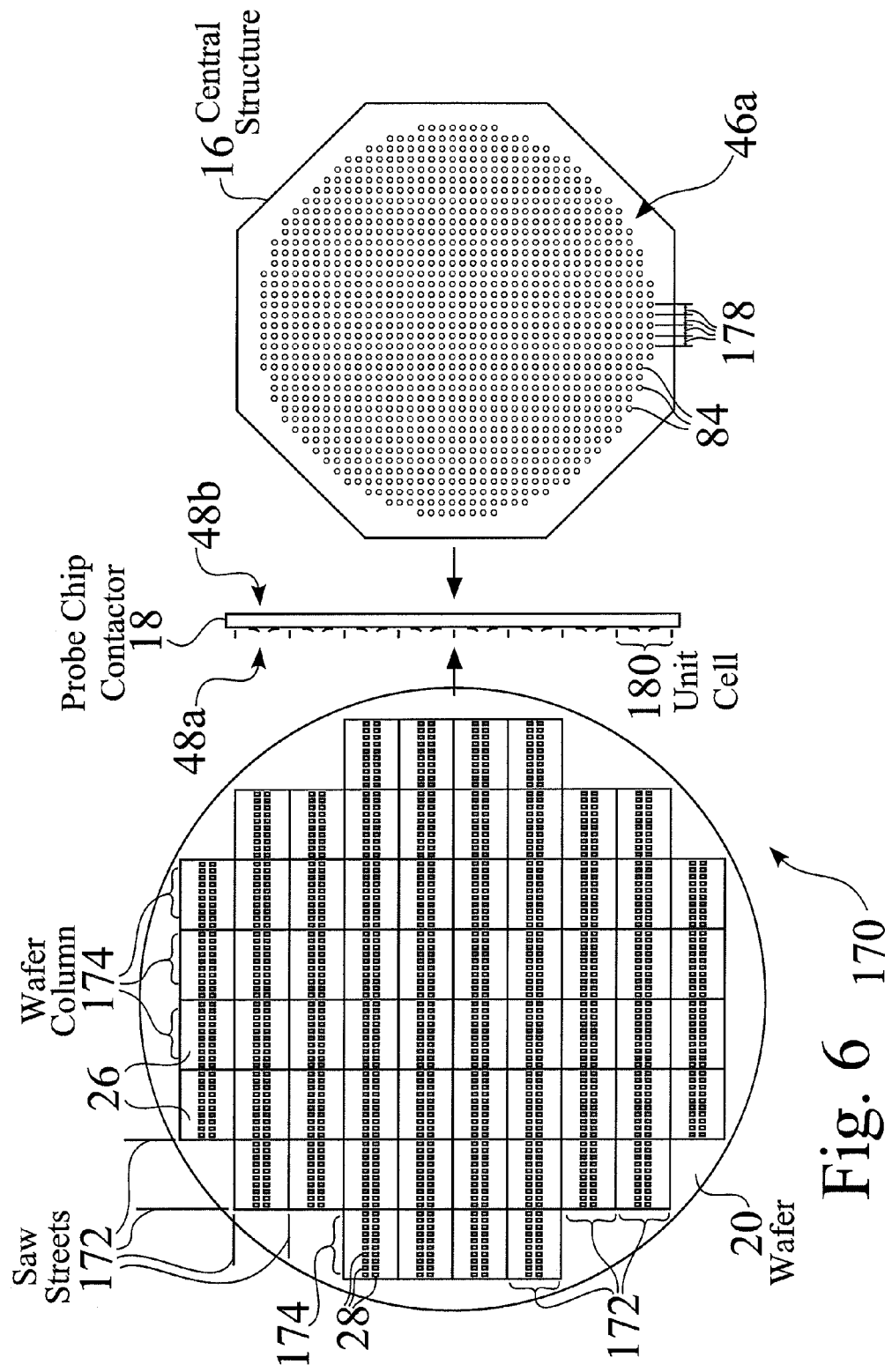
FIG. 6 is an expanded schematic view of exemplary boundary conditions for the design of a probe chip contactor.

FIG. 6 is an expanded schematic view 170 of exemplary boundary design constraints for a probe chip contactor 18 arising due to the geometrical constraints of the customer wafer 20 and the central structure 16. The exemplary wafer workpiece 20 seen in FIG. 6 comprises a plurality of die 26, such as arranged across the surface of the wafer 20, e.g. in rows 172 and columns 174 of repeated devices 26. As well, saw streets 176 are also typically designated across a wafer 20, wherein the devices are separable from each other. As also seen in FIG. 6, a central structure 16, e.g. a Z-block, having a size that is similar the probe chip contactor 18, typically includes an array of central structure vias 84, e.g. Z-block vias 84 having pads 83.

As seen in FIG. 6, a probe chip contactor 18 is typically required to provide probe side routing to repeated customer devices 26 having designated regions of contact pads 28, i.e. the probes make contact to multiple ICs 26.

As also seen in FIG. 6, a probe chip contactor 18 is typically required to provide is back side routing to an array of central structure vias 84, e.g. Z-block vias 84, having pads 83. The pitch 178 of the central structure vias 84 is typically much larger than the pitch of the device pads 28, while the central structure pads 83 (FIG. 4) are typically distributed more uniformly across the central structure 16, e.g. more uniform than the device pads 28 in relation to the wafer 20, to provide a sufficient number of contacts 83 for the probe assembly 42.

Figure 7:
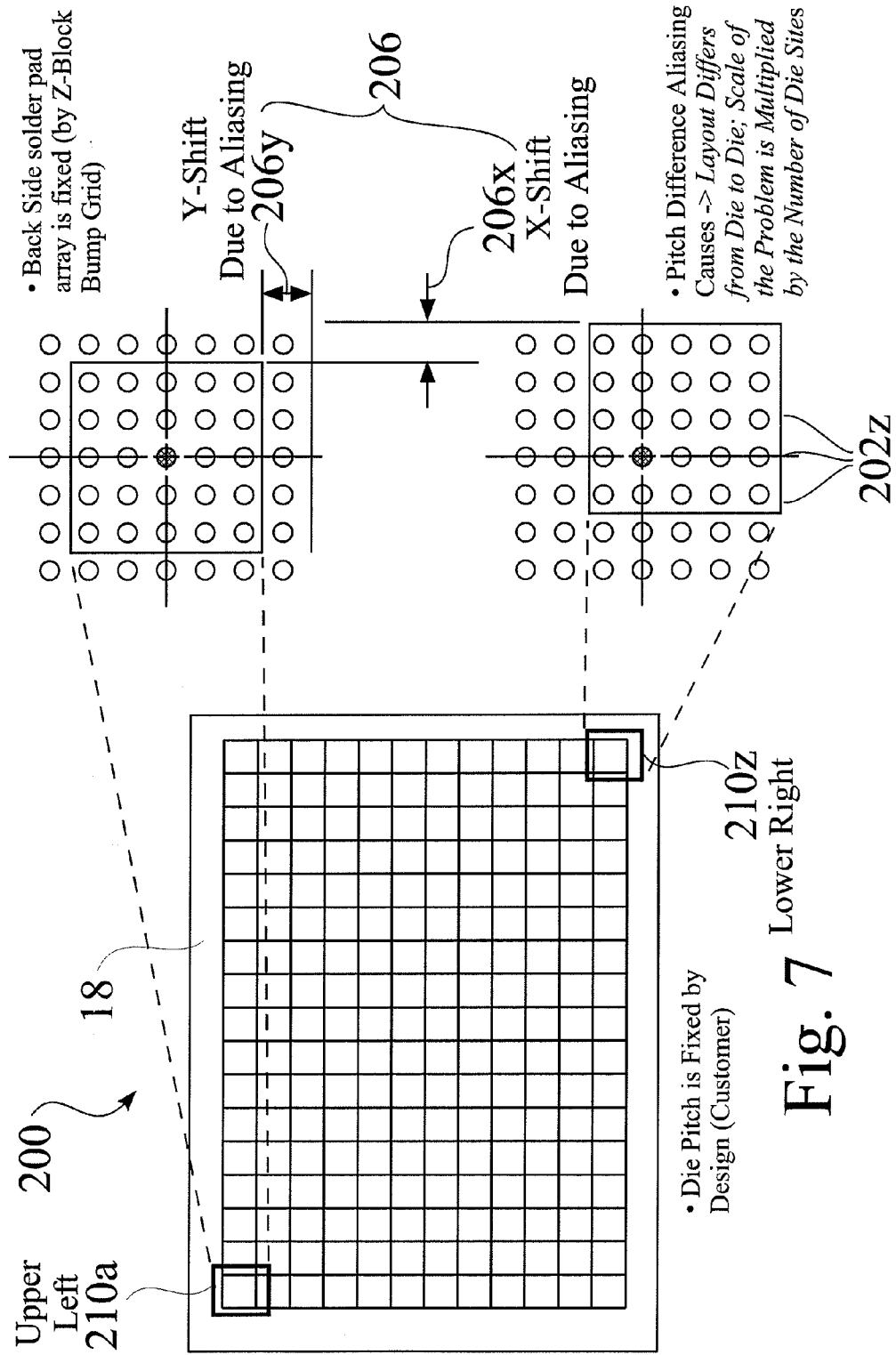
FIG. 7 shows a standard die site layout for exemplary DRAM probe chips.
Figure 8:
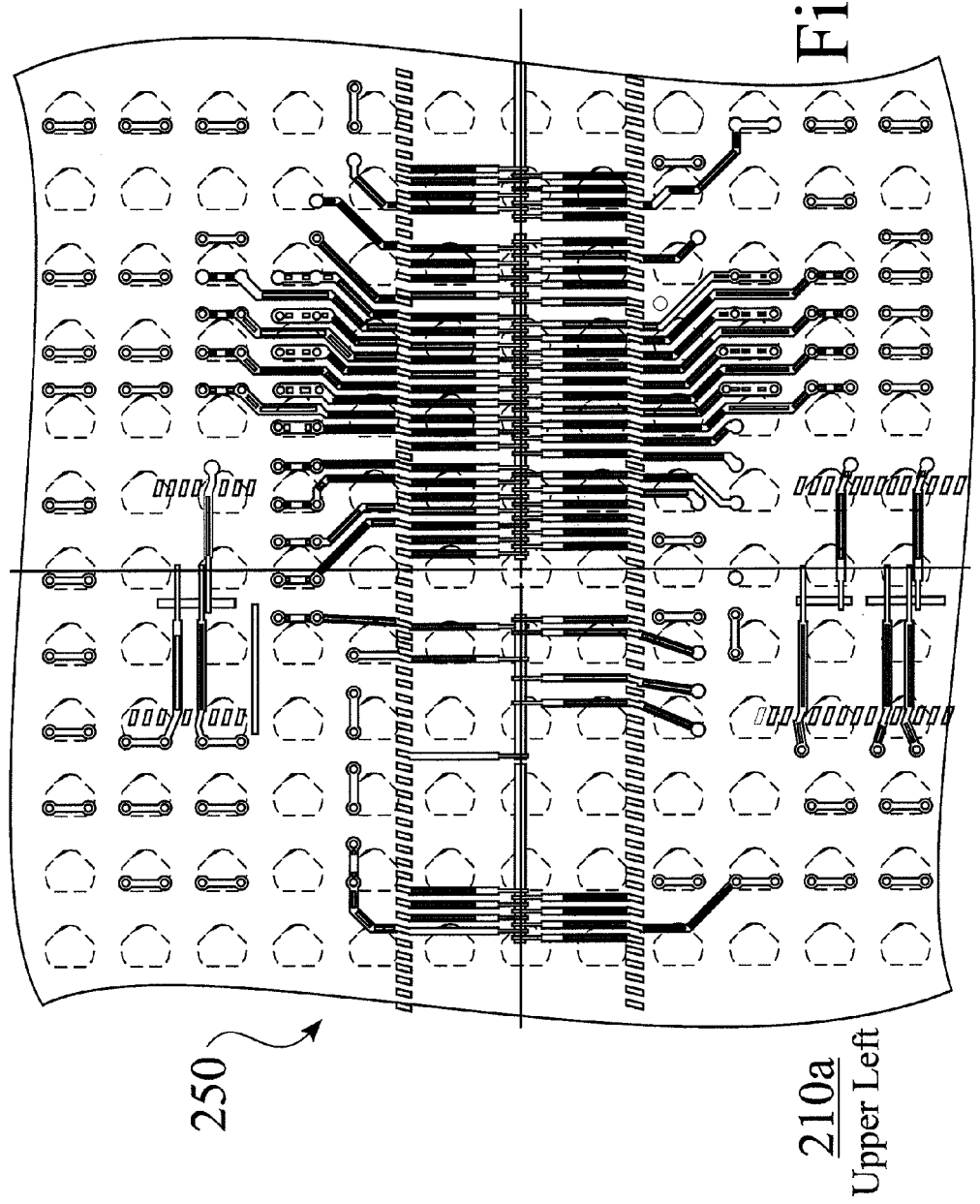
FIG. 8 is an exemplary plan view of probe chip routing associated with a first die site.
Figure 9:
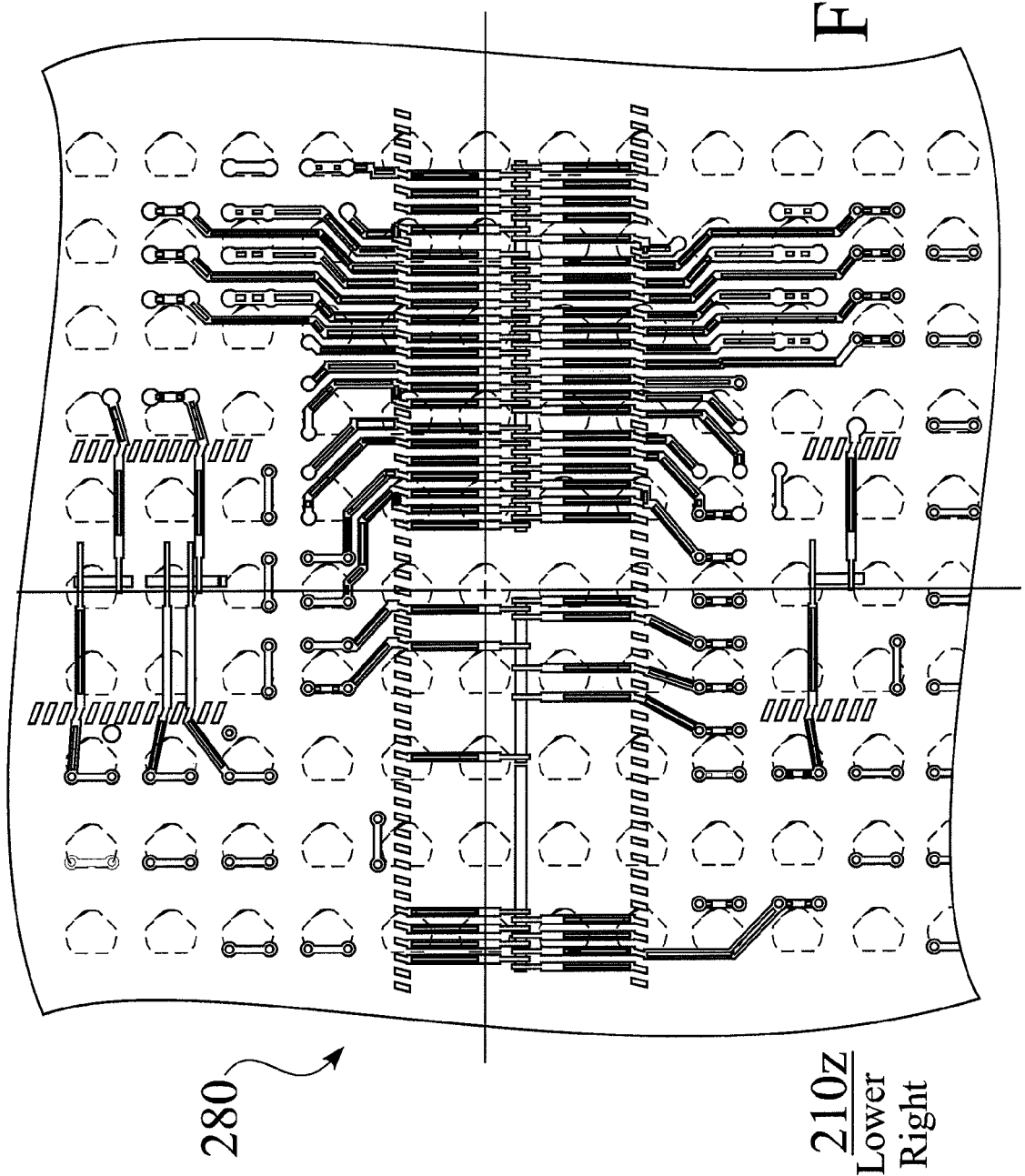
FIG. 9 is an exemplary plan view of probe chip routing associated with a second die site separated from the first die site shown in FIG. 8.

FIG. 7 is an exemplary plan view 200 of a standard die site layout, i.e. without multi-level routing, for exemplary DRAM probe chips. FIG. 8 is an exemplary plan view 250 of probe chip routing associated with a first die site. FIG. 9 is an exemplary plan view 280 of probe chip routing associated with a second die site separated from the first die site shown in FIG. 8.

The exemplary DRAM probe side layout seen in FIG. 7 shows 204 devices 26 located on a customer wafer 20, arranged in twelve rows and fourteen columns (12×14=204 devices). The top left probe cell 210a and the lower right probe cell 210z that contact associated devices 26 are shown schematically in FIG. 7, and are shown in greater detail in FIG. 8 and FIG. 9 respectively.

As seen in the exemplary layout for DRAM probe chips shown in FIG. 7, FIG. 8 and FIG. 9, the required connections to the large number, e.g. 204, of die sites 26 results in a progressively increasing misalignment in X and Y or aliasing 206 between the die 26 pads and the solder pads on the central structure 16, e.g. the Z-block 16. As seen in FIG. 7, FIG. 8 and FIG. 9, the effect of the aliasing effect 206, e.g. comprising X-shift aliasing 206x and Y-shift aliasing 206y, is to require that the routing connections between the spring probes 40,86 and the back side pads 64 are different for each die site. The requirement for differing routing patterns for each die site caused be aliasing 206 mandates hand-crafted, i.e. manual, design layout, if possible at all, to create specific routing paths that extend through the probe chip contactor 18 toward the central structure 16. Such manual design work is prone to errors, and often requires a long cycle time, e.g. often greater than two months.

In contrast to prior art structures which do not have a mechanism to compensate for aliasing 206, the multi-level routing probe chip contactor structure 80 and associated process 150 provide significant improvements to manual and/or automated design layout methods, such as by applying different technologies were they are best suited. For example, the structures on the probe side 48a of the probe chip contactor 18 typically comprise MEMS technologies, including photolithographically formed stress metal springs, which provide advanced probe side spring structures.

As the probe side design is intensive and is specific to the design of a customer dies 26, the multi-level routing probe chip contactor structure 80 and associated process 150 typically comprises the use of a standard unit cell 180 (FIG. 6). While a standard unit cell 180 may inherently be complex, the design is only required to be done once, since the design can be stepped and repeated across the probe side 48a of the probe chip contactor substrate 30. Therefore, each standard cell 180 includes the same front side spring design layout, routing, and thieving for all sites 26, i.e. from the probe tips to the substrate vias 66.

In contrast to probe side design requirements, connector side design between a probe chip contactor substrate 30 and a central structure 16 typically requires connection to a "standard" layout of contacts, e.g. solder pads 83. The multi-level routing probe chip contactor structure 80 and associated process 150 preferably includes a plurality, e.g. two, of electrically conductive layers 114,118 (FIG. 3), which provides a greater degree of freedom to create conductive traces to match the central structure landing pads 83. This portion of the design may comprise classical "Manhattan" routing design criteria, which can be accomplished without human intervention, through auto-routing processing between the two boundary layer information data sets, e.g. substrate via sites 66 on the probe chip contactor, and the set, i.e. grid, of Z-block solder pads 83.

Figure 15:
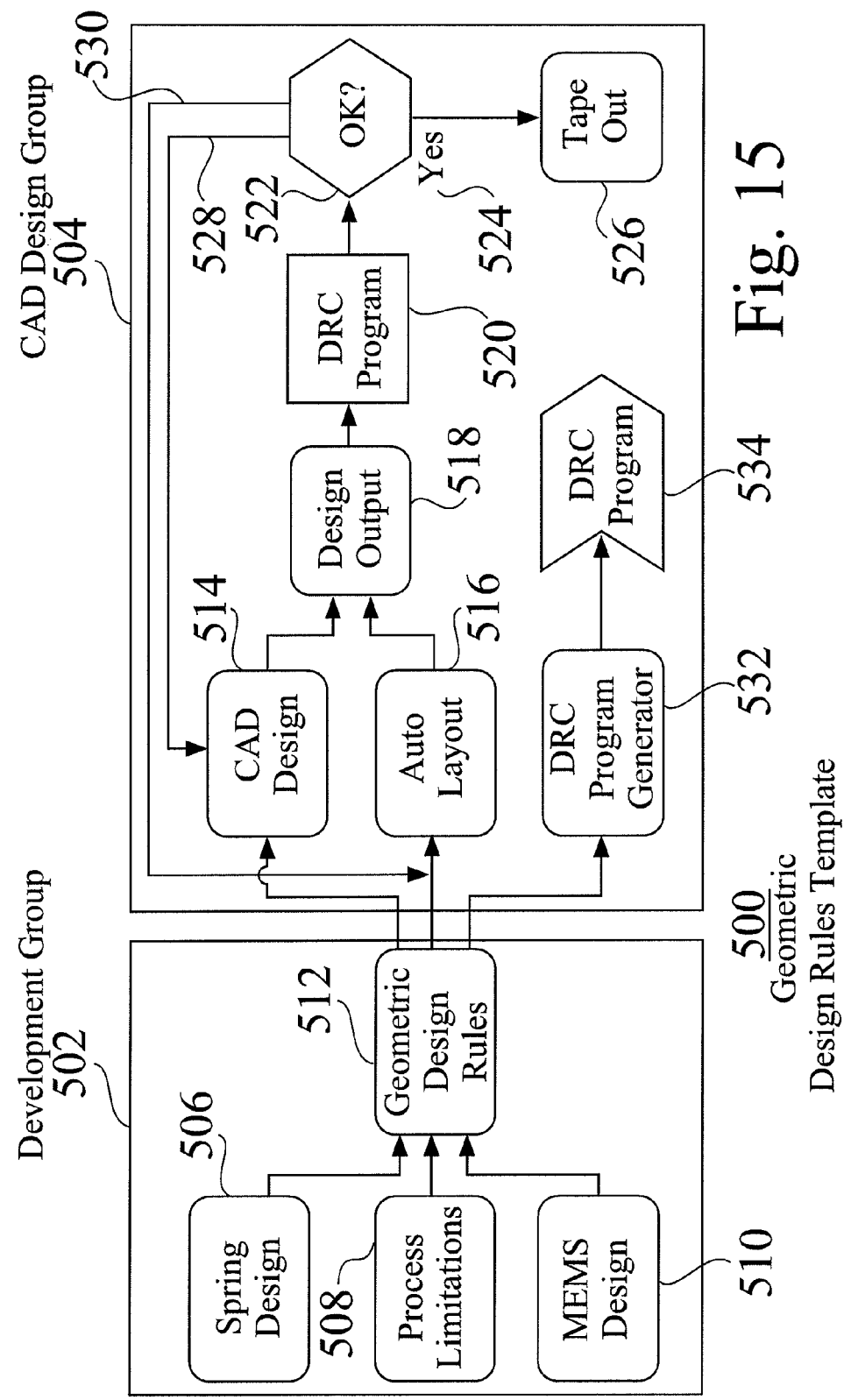
FIG. 15 is a schematic plan view of a geometric design rule template implemented between a development group and a CAD design group.

Using a stepped and repeated unit cell on the probe side 48a of the probe chip substrate 30, and unconstrained X-Y routing on the contact side 48b of the probe chip substrate 30, it is thereby possible to accommodate, i.e. overcome, the aliasing effect, by using different routing patterns for each die on the contact side 48b of the probe chip substrate 30, such as without compromising productivity, since the contact side routing layers are auto-routable, such as through algorithm-based computer processing 516 (FIG. 15).

For example, in the prior art, the aliasing effect resulted in not fully populating some of the central structure pads 83 and respective vias 84, thereby requiring larger areas of the substrate 16 to accommodate all of the connections of a device 26. In contrast, unconstrained X-Y routing on the contact side 48b of the probe chip substrate 30 allows contact side routing to shift as desired, e.g. such as but not limited to inward routing, to shift back and fully populate all central structure 83 and respective vias 84.

As well, the required design time for the multi-level routing probe chip contactor structure 80 and associated process 150 may be improved significantly, especially for very large probe chips 18, that are connectable to die having a large number of ICs 26 and/or total contact pads 28. The value of the multi-level routing probe chip contactor structure 80 and associated process 150 is proportional to the size and complexity of a probe chip contactor 18, which can result in savings in cost and/or time, such that the technology provides a significant competitive edge.

FIG. 10 is a first schematic plan view 300 of multi-layer routing structure. FIG. 11 is a second schematic plan view 330 of multi-layer routing structure using algorithm-based mask layer generation. As seen in FIG. 10 and FIG. 11, multiple layer conductive routing, e.g. 106, 302 and connections 304 between routing layers, on either the probe side 48a or the connection side 48b of the probe chip contactor 18, provides a high degree of freedom, e.g. such as allowing routing crossovers in any direction, i.e. unconstrained routing. As well, a large portion of the routing design can be provided by auto-routing 516 (FIG. 15). For example, as seen in FIG. 11, anchors 335 can be provided to bond overlapping layers together to prevent delamination and the layout for such anchor details 335 can readily be performed automatically 516, i.e. without human intervention, once primary design parameters are determined.

Figure 12:
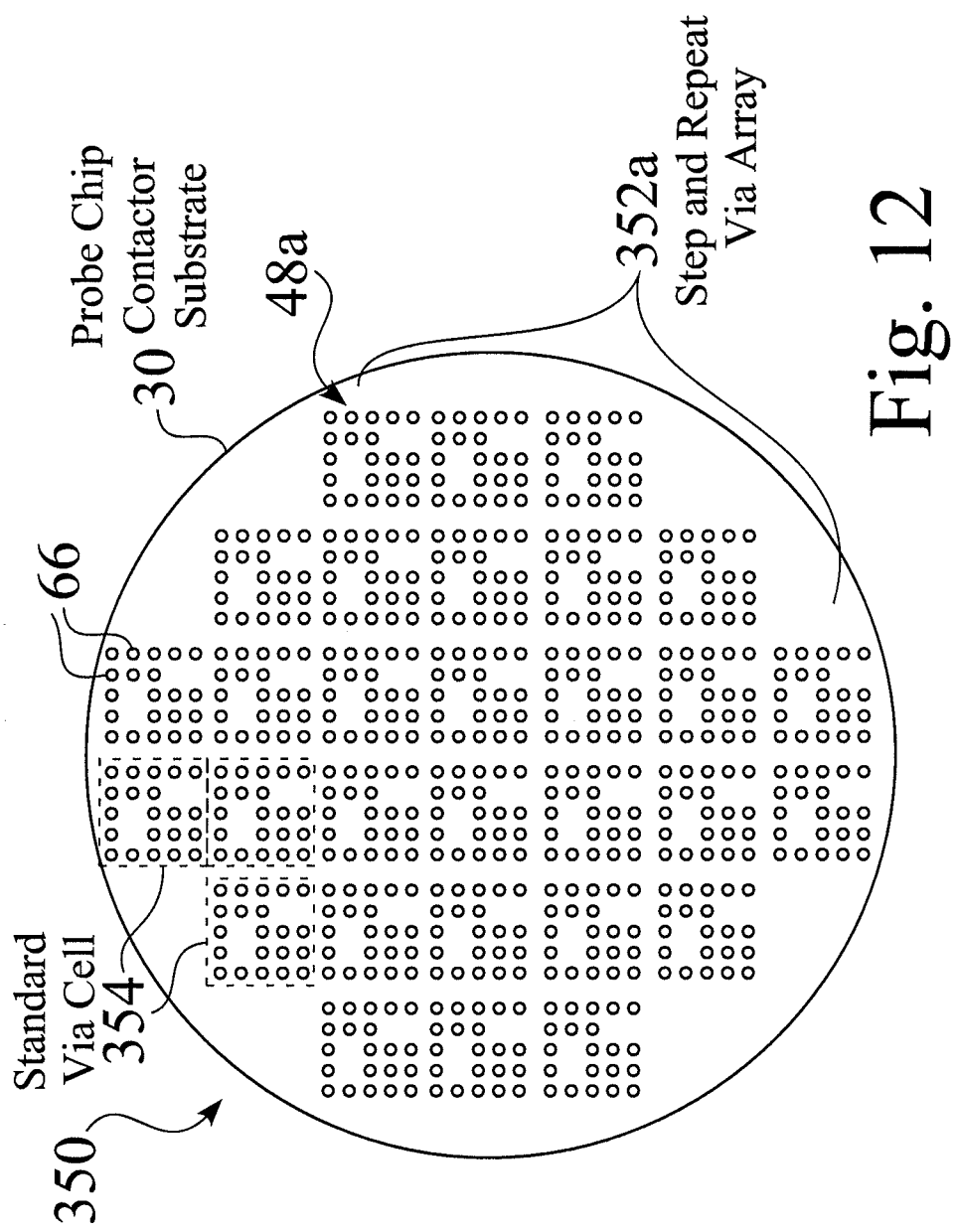
FIG. 12 is a simplified schematic plan view of a probe chip contactor substrate having an array of probe chip vias, wherein the vias are arranged in repeated standard cells, corresponding to standard probe side routing cells for respective devices.

FIG. 12 is a simplified schematic plan view 350 of a probe chip contactor substrate 30 having an array 352 of probe chip vias 84, wherein the vias 84 are arranged in repeated standard cells 354 corresponding to standard probe side routing cells for respective devices 26 and to contact side routing for connection to a central structure 16, e.g. a Z-block 16.

Figure 13:
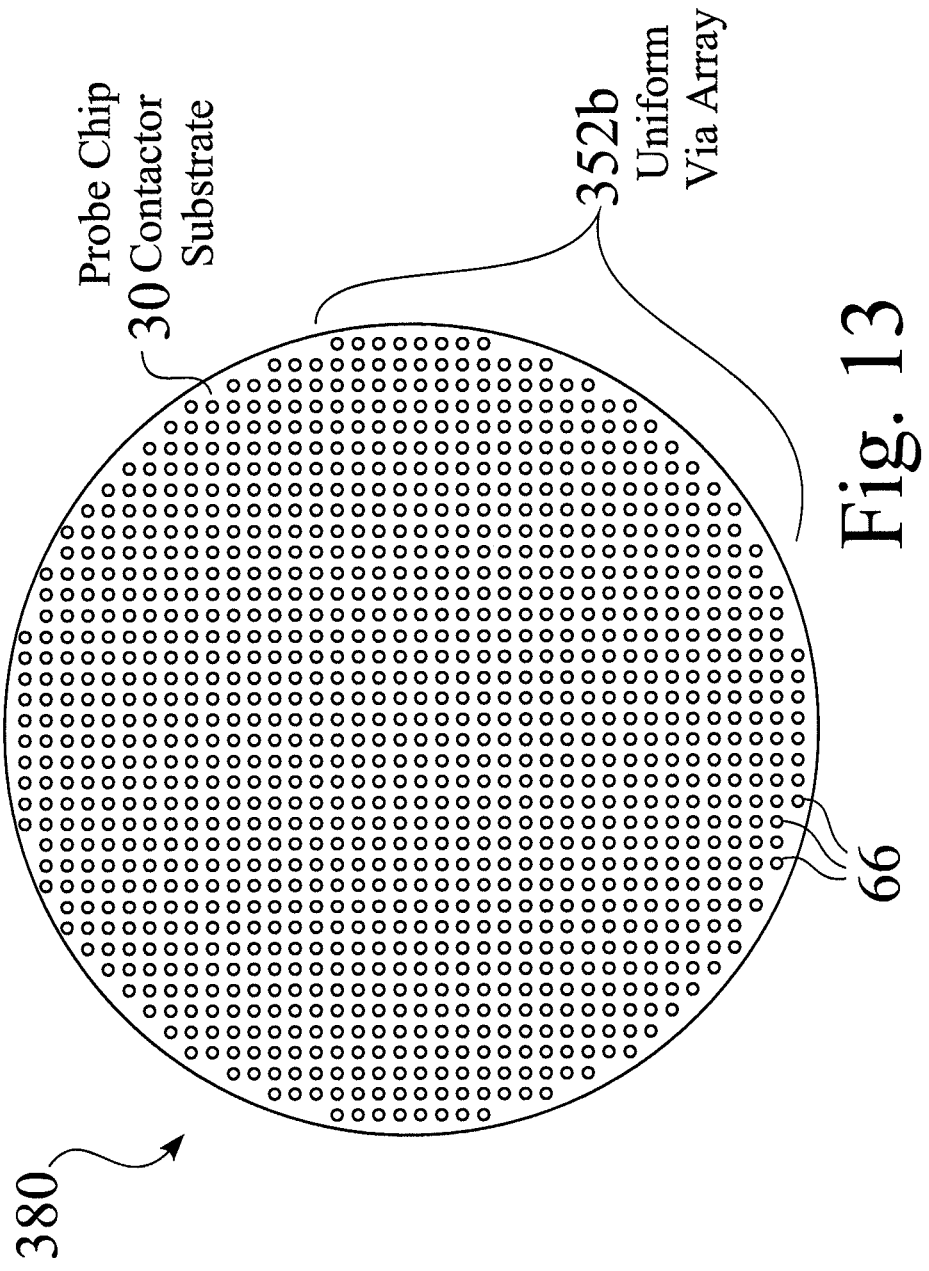
FIG. 13 is a simplified schematic plan view of a probe chip contactor substrate having an array of probe chip vias, wherein the vias are arranged in a continuous array over a usable area of the probe chip contactor, such as preformed to provide routing to standard probe side routing cells associated with respective devices.

FIG. 13 is a simplified schematic plan view 380 of a probe chip contactor substrate 30 having an array of probe chip vias, wherein the vias are arranged in a continuous array over a usable area of the probe chip contactor, such as preformed to provide routing to standard probe side routing cells associated with respective devices and to contact side routing for connection to a central structure 16, e.g. a Z-block 16.

FIG. 14 an exemplary process 150b for standard cell architecture and automatically routed interconnections for a multi-layer routing structure, using a probe chip 18 having predetermined array 352, e.g. 352a,352b, of vias 84, such as a uniform array 352b, i.e. a sea of vias 84 (FIG. 13), or an array 352a repeated unit cells 354 of vias (FIG. 12). While the process 150b is similar to the process 150a shown in FIG. 5, a standardized probe chip substrate 30 may be provided 402 before receipt 152 of a customer wafer design, such as to significantly reduce the time required to design and manufacture probe chip contactors 18 for a given application 152.

FIG. 15 is a schematic plan view of a geometric design rule template 500 implemented between a development group 502 and a CAD design group 504. As seen in FIG. 15, geometric design rules 512 are established by a development module, such as implemented by a computer, with inputs comprising spring design 506, process limitations 508, and MEMS design.

The output geometric design rules are then provided as inputs 503, such as through a CAD design group 504 implemented on a computer, wherein the inputs 503 can be used by any of a CAD design module 514, an automatic layout module 516, and a DRC program generator 532, e.g. to produce a DRC program 534. Design output 518 is provided by the CAD design module 514 and the automatic layout module 516, e.g. a computer running auto-routing, algorithm-based software, which is then typically transferred to a DRC program. A determination 522 is then made it confirm whether the output design meets all the requirements of the front and back side of the probe chip contactor 18. If the determination is positive 524, the result is output 526, such as to tape for manufacturing use. If the determination is not positive 530, the output 528,530 is reiteratively sent to any of the CAD design module 514 and the auto layout module 516, until the design requirements are met. 524.

In some embodiments of the multiple routing probe card structure 80 and associated method 150, a semiconductor wafer 20 is provided, comprising an array of semiconductor devices 26, wherein each of the semiconductor devices 26 comprises a plurality of electrical connection terminals 28. A design is then provided for a probe chip substrate 30 having a probe side 48a and a connection, i.e. contact side 48b, and comprising an array of MEMS IC device contactors 40, each member of the array comprising a plurality of spring contacts 40, 86 connected by one or more routing layers on the probe side 48a of the substrate 30 to a corresponding plurality of substrate vias 66 forming a standard substrate via pattern, the array formed by configuring a plurality of MEMS IC device contactors into a grid with fixed X and Y spacings over the usable area of the substrate 30. Each of the MEMS IC device contactors is connected to a set of respective contact pads 64 on the connection side 48b of the probe chip contactor 18 having a predetermined X and Y spacing, using two or more routing layers on the probe chip contactor side 48b of the substrate 30, and compensating for aliasing 206 caused by any differences in the X and Y grid spacing of the array of MEMS IC device contactors and the pre-determined X and Y spacing of the central structure, e.g. Z-block contact pads 83, by creating custom routing patterns between the standard pattern of substrate vias 66 for each contactor 40 and the z-block contact pads 83.

The multi-layer interconnect and signal routing capabilities described herein can be to used for fabricating controlled impedance transmission lines on any of the front and back sides of the substrate and combinations thereof.

While some embodiments of the structures and methods disclosed herein are implemented for the fabrication of photolithographically patterned springs, the is structures and methods may alternately be used for a wide variety of connection environments, such as to provide mechanical compliance and/or electrical connections between any of contacts, connectors, and/or devices or assemblies, over a wide variety of processing and operating conditions.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

The invention claimed is:

1. An apparatus for providing electrical connections between a semiconductor wafer comprising an array of semiconductor devices, and a central structure, wherein each of the semiconductor devices comprises a plurality of electrical connection terminals, the central structure having a first and a second side and an array of contact pads electrically connected to central structure through-vias on a regular grid having a pre-determined pitch extending over the usable area of the central structure, the apparatus comprising:
   a probe chip substrate having a usable substrate area, a probe side and a connection side opposite the probe side, and comprising an array of electrically conductive substrate through-vias and;
   a plurality of spring contacts on the probe side of the substrate arranged to provide electrical connections to at least one of the devices and one or more electrically conductive routing layers connecting the plurality of spring contacts to a corresponding plurality of the substrate through-vias to form a set of standard electrical connections for the at least one device;
   wherein the set of standard electrical connections is repeated over the usable substrate area to provide simultaneous electrical connections from the through-vias to more than one element of the array of semiconductor devices; and
   one or more electrically conductive routing layers on the connection side of the substrate configured to electrically connect each member of the plurality of substrate through-vias corresponding to each set of standard connections to a corresponding set of contact pads on the central structure to provide simultaneous electrical connections from the central structure contact pads over the usable area of the central structure to one or more of the semiconductor devices.

2. The apparatus of claim 1, wherein the layout pattern of the one or more electrically conductive routing layers on the contact side of the substrate is determined by a computer algorithm.

3. The apparatus of claim 1, further comprising:
   probe chip contact pads defined on the connection side of the substrate and electrically connected to the electrically conductive routing layers; and
   at least one solder bond between at least one of the probe chip contact pads and at least one of the central structure contact pads.

4. The apparatus of claim 1, wherein the central structure comprises a first and a second side and an array of central structure through-vias on a regular grid having a standard pitch corresponding to the contact pads on the contact side of the probe chip, the apparatus further comprising:
 electrical connections between the central structure contact pads and the probe chip contact pads.

5. The apparatus of claim 4, wherein the central structure comprises any of a Z-block, a circuit board, and a daughter card.

6. The apparatus of claim 1, wherein the spring contacts comprise stress metal springs.

7. The apparatus of claim 1, wherein at least one of the electrically conductive routing layers provide controlled impedance on any of the probe side and the contact side of the probe chip substrate.

8. The apparatus of claim 1, wherein at least one of the electrically conductive routing layers on any of the probe side and the contact side comprises any of copper, nickel, gold, MoCr, titanium, chromium, TiNi, and CrNi.

9. The apparatus of claim 1, wherein the standard set of electrical connections comprises at least two electrically conductive routing layers on any of the probe side and the contact side of the probe chip substrate, the apparatus further comprising:
 at least one electrically insulative layer between the two electrically conductive routing layers.

10. The apparatus of claim 9, wherein at least one of the electrically insulative layers comprises any of Polyimide and benzocyclobutene (BCB).

11. A process, comprising the steps of:
 providing a design layout for a semiconductor wafer comprising an array of semiconductor devices, wherein each of the semiconductor devices comprises a plurality of electrical connection terminals;
 providing a design for a probe chip substrate having a probe side and a contact side and comprising an array of electrically conductive substrate through-vias;
 establishing a layout for a plurality of spring contacts on the probe side of the substrate arranged to provide electrical connections to at least one of the devices and one or more electrically conductive routing layers connecting the plurality of spring contacts to a corresponding plurality of the substrate through-vias to form a set of standard electrical connections for the at least one device;
 repeating the set of standard electrical connections to provide a layout for simultaneous electrical connections from the through-vias to more than one element of the array of semiconductor devices; and
 establishing a layout for one or more electrically conductive routing layers on the contact side of the substrate connecting each member of the plurality of through-vias corresponding to each set of standard connections to a corresponding set contact pads on a regular grid having a pre-determined via pitch thereby establishing simultaneous electrical connections from the contact pads to one or more of the semiconductor devices.

12. The process of claim 11, further comprising the step of:
 providing a central structure having a first and a second side and an array of central structure through-vias on a regular grid having a standard pitch corresponding to the contact pads on the contact side of the probe chip and the z-block contact pads electrically connected to the probe chip contact pads.

13. The process of claim 12, wherein the central structure comprises any of a Z-block, a PC board, and a daughter card.

14. The process of claim 11, wherein the spring contacts comprise stress metal springs.

15. The process of claim 11, wherein at least one of the electrically conductive routing layers provide controlled impedance on any of the probe side and the contact side of the probe chip substrate.

16. The process of claim 11, wherein at least one of the electrically conductive routing layers on any of the probe side and the contact side comprises any of to copper, nickel, gold, MoCr, titanium, chromium, TiNi, and CrNi.

17. The process of claim 11, wherein the probe chip substrate further comprises at least two electrically conductive routing layers on the probe side of the probe chip substrate, and an electrically insulative layer between the electrically conductive routing layers.

18. The process of claim 17, wherein the electrically insulative layer comprises any of polyimide and benzocyclobutene (BCB).

19. The process of claim 11, wherein the probe chip substrate further comprises at least two independently unconstrained electrically conductive routing layers on the contact side of the probe chip substrate, and an electrically insulative layer between the electrically conductive routing layers.

20. The process of claim 19, wherein the electrically insulative layer comprises any of polyimide and benzocyclobutene (BCB).

21. A process, comprising the steps of:
 providing a layout of a semiconductor wafer comprising a plurality of integrated circuits at pre-defined locations, each integrated circuit comprising a set of electrical connection pads;
 providing a layout of probe chip substrate having a probe side and a contact side, and through-vias at undetermined locations;
 creating a unit standard cell on the probe side of the probe chip, comprising substrate spring contacts located for contacting the connection pads on the integrated circuits and one or more electrically conductive routing layers for connecting the spring contacts to a set of probe chip substrate through vias located in a standard pattern;
 creating a wafer scale standard cell layout on the probe side of the probe chip, by stepping and repeating the standard cell layout, so that each unit cell matches a pre-selected location of an integrated circuit on the semiconductor wafer;
 providing a layout of a central structure, comprising a fixed array of vias with fixed X, Y, and Z locations; and
 creating auto-routed electrically conductive routing layers on the contact side of the probe chip substrate to provide electrical connections between the substrate through vias and the Z-block through vias.

22. The process of claim 21, further comprising the step of:
 providing a central structure having a first and a second side and an array of central structure through-vias on a regular grid having a standard pitch corresponding to the contact pads on the contact side of the probe chip and the Z-block contact pads electrically connected to the probe chip contact pads.

23. The process of claim 22, wherein the central structure comprises any of a Z-block, a PC board, and a daughter card.

24. The process of claim 22, further comprising the step of: electrically attaching the central structure to the probe chip.

25. The process of claim 24, wherein the electrically attachments comprise solder.

26. The process of claim 21, wherein the spring contacts comprise stress metal springs.

27. The process of claim 21, wherein at least one of the electrically conductive routing layers provide controlled impedance on any of the probe side and the contact side of the probe chip substrate.

28. The process of claim 21, wherein at least one of the electrically conductive routing layers on any of the probe side and the contact side comprises any of copper, nickel, gold, MoCr, titanium, and chromium, TiNi, CrNi.

29. The process of claim 21, wherein the probe chip substrate further comprises at least two electrically conductive routing layers on the probe side of the probe chip substrate, and an electrically insulative layer between the electrically conductive routing layers.

30. The process of claim 29, wherein the electrically insulative layer comprises any of polyimide and benzocyclobutene (BCB).

31. The process of claim 21, wherein the probe chip substrate further comprises at least two independently unconstrained electrically conductive routing layers on the contact side of the probe chip substrate, and an electrically insulative layer between the electrically conductive routing layers.

32. The process of claim 31, wherein the electrically insulative layer comprises any of polyimide and benzocyclobutene (BCB).

33. A system for providing a design for a probe chip contactor for providing electrical connections between a semiconductor wafer comprising an array of semiconductor devices, and a central structure, wherein each of the semiconductor devices comprises a plurality of electrical connection terminals, the central structure having a first and a second side and an array of contact pads electrically connected to central structure through-vias on a regular grid having a pre-determined pitch extending over the usable area of the central structure, the system comprising:
means for receiving a design for the semiconductor wafer;
means for establishing a probe side design for a probe chip contactor;
receiving a signal at a computer system, the signal comprising as inputs the layout of the through-vias of the probe chip contactor, and the standard layout of a central structure having a standard layout with X-Y offsets of solder pads;
determining a routing pattern through one or more conductive layers on the connector side of the probe chip substrate to solder pads that are alignably connectable to the central structure, wherein the routing pattern is a repeated standard cell.

34. A process, comprising the steps of:
providing a probe chip contactor substrate having a probe side and a contact side, and through-vias at predetermined locations;
providing a layout of a semiconductor wafer comprising a plurality of integrated circuits at pre-defined locations, each integrated circuit comprising a set of electrical connection pads;
creating a unit standard cell on the probe side of the probe chip, comprising substrate spring contacts located for contacting the connection pads on the integrated circuits and interconnect traces for connecting the spring contacts to a set of probe chip contactor vias;
creating a wafer scale standard cell layout on the probe side of the probe chip, by stepping and repeating the standard cell layout, so that each unit cell matches a pre-selected location of an integrated circuit on the semiconductor wafer;
providing a layout of a central structure, comprising a fixed array of vias with fixed X, Y, and Z locations; and
creating auto-routed interconnect traces in the contact side of the probe chip substrate to provide electrical connections between the substrate through vias and the Z-block through vias.

35. The process of claim 34, wherein a computer operates on a signal comprising data associated with the probe chip contactor and the central structure, using an algorithm to perform the auto-routing step, the process further comprising the step of:
providing a design output signal comprising a design for the interconnect traces on the contact side of the probe chip substrate.

36. The process of claim 34, wherein the preestablished probe chip contactor vias are arranged in repeatable blocks of arrays, wherein each array is preestablished to provide connections for a single device.

37. The process of claim 34, wherein the preestablished probe chip contactor vias are arranged to have a uniform density across a usable region of the probe chip contactor substrate.

38. An apparatus for providing electrical connections between a semiconductor wafer comprising an array of semiconductor devices, and a central structure, wherein each of the semiconductor devices comprises a plurality of electrical connection terminals, the central structure having a first and a second side and an array of contact pads electrically connected to central structure through-vias on a regular grid having a pre-determined pitch extending over the usable area of the central structure, the apparatus comprising:
a probe chip substrate having a usable substrate area, a probe side and a contact side opposite the probe side, and comprising an array of electrically conductive substrate through-vias and;
a plurality of spring contacts on the probe side of the substrate arranged to provide electrical connections to at least one of the devices and one or more electrically conductive routing layers connecting the plurality of spring contacts to a corresponding plurality of the substrate through-vias to form a standard pattern of standard electrical connections for the at least one device; and
a plurality of electrically conductive routing layers on the contact side of the substrate configured to electrically connect each member of the plurality of substrate through-vias corresponding to each set of standard connections to a corresponding set of contact pads on the central structure to provide simultaneous electrical connections from the central structure contact pads over the usable area of the central structure to one or more of the semiconductor device;
wherein the routing for the plurality of electrically conductive routing layers insures full utilization of the z-block pads below each standard pattern.

39. A process, comprising the steps of:
providing a semiconductor wafer comprising an array of semiconductor devices, wherein each of the semiconductor devices comprises a plurality of electrical connection terminals;
providing a design for a probe chip substrate having a probe side and a connection side, and comprising an array of MEMS IC device contactors, each member of the array comprising a plurality of spring contacts connected by one or more routing layers on the probe side of the substrate to a corresponding plurality of substrate vias forming a standard substrate via pattern, the array formed by configuring a plurality of MEMS IC device contactors into a grid with fixed X and Y spacings over the usable area of the substrate;

and electrically connecting each of the MEMS IC device contactors to a set of respective contact pads on the connection side of the probe chip contactor having a predetermined X and Y spacing, using two or more routing layers on the probe chip contactor side of the substrate, and compensating for aliasing caused by any differences in the X and Y grid spacing of the array of MEMS IC device contactors and the pre-determined X and Y spacing of the z-block contact pads, by creating custom routing patterns between the standard pattern of substrate vias for each contactor and the z-block contact pads.

40. The process of claim 39, wherein the MEMS IC device contactor comprises microfabricated spring contacts.

41. The process of claim 39, wherein the MEMS IC device contactor comprises stress metal springs.

42. An apparatus for connection to a semiconductor wafer comprising an array of semiconductor devices, wherein each of the semiconductor devices comprises a plurality of electrical connection terminals, comprising:

a probe chip substrate having a probe side and a connection side, and comprising an array of MEMS IC device contactors, each member of the array comprising a plurality of spring contacts connected by one or more routing layers on the probe side of the substrate to a corresponding plurality of substrate vias forming a standard substrate via pattern, the array formed by configuring a plurality of MEMS IC device contactors into a grid with fixed X and Y spacings over the usable area of the substrate; and electrical connections between each of the MEMS IC device contactors to a set of respective contact pads on the connection side of the probe chip contactor having a predetermined X and Y spacing, using two or more routing layers on the probe chip contactor side of the substrate, and compensating for aliasing caused by any differences in the X and Y grid spacing of the array of MEMS IC device contactors and the pre-determined X and Y spacing of the z-block contact pads, by creating custom routing patterns between the standard pattern of substrate vias for each contactor and the z-block contact pads.

43. The apparatus of claim 42, wherein the MEMS IC device contactor comprises microfabricated spring contacts.

44. The apparatus of claim 42, wherein the MEMS IC device contactor comprises stress metal springs.

* * * * *